United States Patent [19]

Takasugi

[11] Patent Number: 5,544,096
[45] Date of Patent: *Aug. 6, 1996

[54] SEMICONDUCTOR MEMORY DEVICE HAVING VOLATILE STORAGE UNIT AND NON-VOLATILE STORAGE UNIT

[75] Inventor: Atsushi Takasugi, Tokyo, Japan

[73] Assignee: Oki Electric Industry Co., Ltd., Tokyo, Japan

[*] Notice: The term of this patent shall not extend beyond the expiration date of Pat. No. 5,418,739.

[21] Appl. No.: 471,778

[22] Filed: Jun. 6, 1995

Related U.S. Application Data

[62] Division of Ser. No. 240,063, May 9, 1994.

[30] Foreign Application Priority Data

May 31, 1993 [JP] Japan ................... 5-129814

[51] Int. Cl.⁶ ........................... G11C 11/24
[52] U.S. Cl. .................. 365/149; 365/63; 365/102
[58] Field of Search ........................ 365/207, 149, 365/202, 63, 102

[56] References Cited

U.S. PATENT DOCUMENTS

| | | | |
|---|---|---|---|
| 5,062,077 | 10/1991 | Takashima et al. | 365/69 |
| 5,148,063 | 9/1992 | Hotta | 307/530 |
| 5,285,413 | 2/1994 | Miyauchi et al. | 365/149 X |
| 5,303,183 | 4/1994 | Asakura | 365/149 |
| 5,305,263 | 4/1994 | Morgan | 365/149 X |
| 5,367,481 | 11/1994 | Takase et al. | 365/149 |
| 5,384,733 | 1/1995 | Sueoka et al. | 365/149 X |
| 5,418,739 | 5/1995 | Takasugi | 365/149 |

FOREIGN PATENT DOCUMENTS

| | | |
|---|---|---|
| 59-225615 | 12/1984 | Japan . |
| 60-47294 | 3/1985 | Japan . |
| 64-8591 | 1/1989 | Japan . |
| 03269894 | 12/1991 | Japan . |

*Primary Examiner*—Do H Yoo
*Attorney, Agent, or Firm*—Law Office of Steven M. Rabin

[57] ABSTRACT

A semiconductor memory, device of the invention includes memory cells each having a transistor and a capacitor, bit lines electrically connected to the memory cells, data Dines, transfer circuits each electrically connecting the bit lines and the data lines in response to column selection signals, and conductive lines each electrically connected between a transistor and a capacitor of memory cell selected ones of the and having a predetermined potential. Owing to this arrangement, the semiconductor memory device can be realized wherein volatile memory cells and non-volatile memory cells are provided within a single memory cell array. Further, the semiconductor memory device of the invention is of a semiconductor memory device having high flexibility, wherein the ratio between the volatile memory cells and the non-volatile memory cells can be easily decided according to a user's demand.

8 Claims, 33 Drawing Sheets

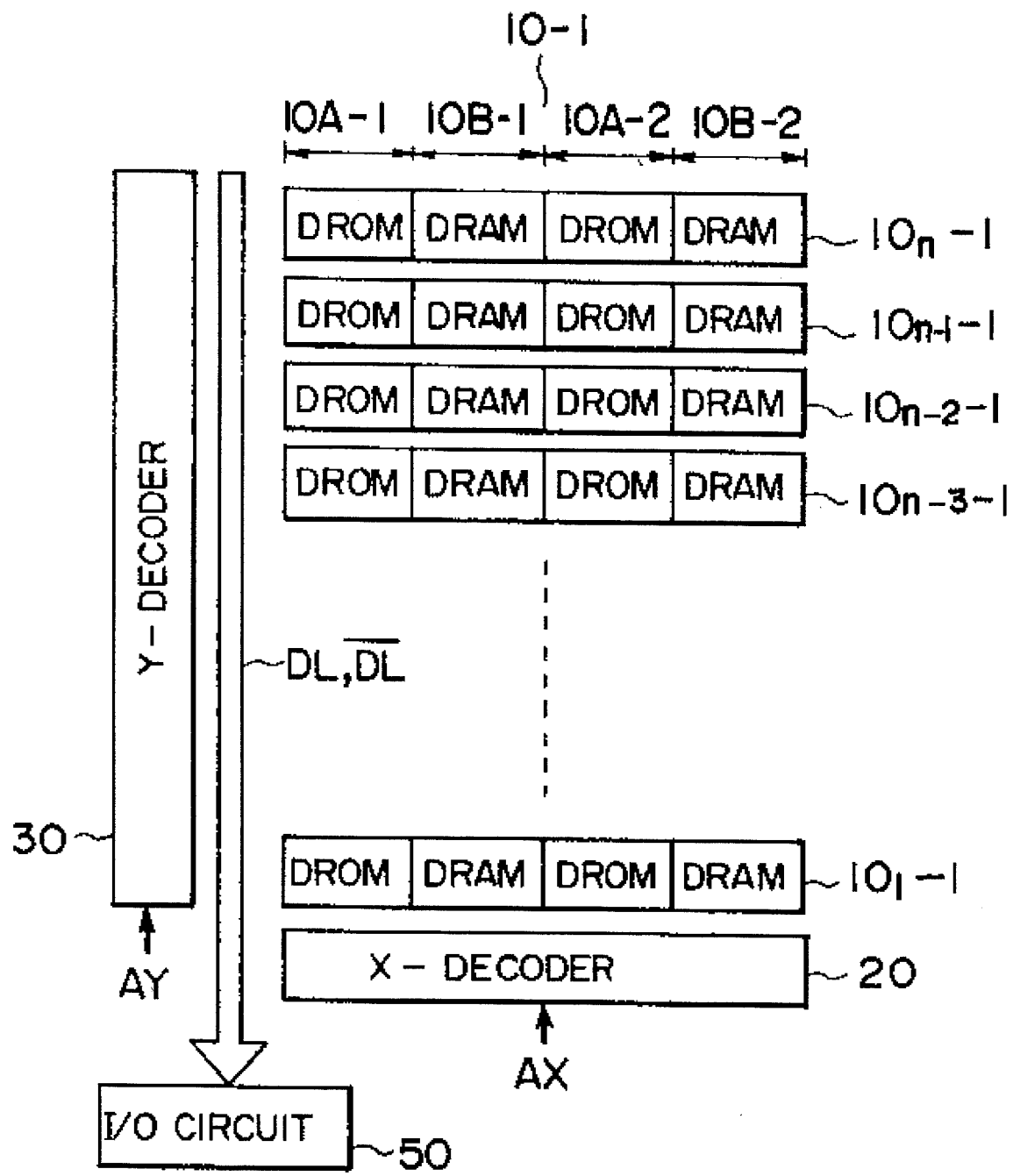

5,544,096

SEMICONDUCTOR MEMORY DEVICE HAVING VOLATILE STORAGE UNIT AND NON-VOLATILE STORAGE UNIT

This is a division of application Ser. No. 08/240,063, filed May 9, 1994.

BACKGROUND OF THE INVENTION

1. Field of the Invention

This invention relates to a semiconductor memory device wherein memory cells used for a readable/writable volatile memory such as a Dynamic Random Access Memory (hereinafter called a "DRAM") and memory cells used for a read-only non-volatile memory like a ROM (Read Only Memory) such as an Electrically Programmable Read Only Memory (hereinafter called an "EPROM"), an Electrically Erasable Programmable Read Only Memory (hereinafter called an "EEPROM"). a mask read only memory or the like are formed within a single memory cell array.

2. Description of the Related Art

A semiconductor integrated circuit having a ROM and a RAM (Random Access Memory) provided within a single chip has recently been manufactured in products with the advance of its high integration.

This type of semiconductor integrated circuit has been disclosed in Japanese Patent Application Laid-Open Publication Nos. 60-47294 published on Mar. 14, 1985, 64-8591 published on Jan. 12, 1989 and 3-269894 published on Dec. 2, 1991.

SUMMARY OF THE INVENTION

It is an object of the present invention to provide a semiconductor memory device wherein volatile memory cells and non-volatile memory cells are provided within a single memory cell array.

it is another object of the present invention to provide a semiconductor memory device wherein volatile memory cells and non-volatile memory cells can be easily and inexpensively constructed within a single memory cell array.

It is a further object of the present invention to provide a semiconductor memory device having high flexibility, which is capable of easily deciding the ratio between a volatile memory cell section and a non-volatile memory cell section according to a user's demand.

In order to achieve the above objects, the present invention comprises a plurality of memory cells each comprising a transistor and a capacitor, bit lines respectively electrically connected to the plurality of memory cells, data lines, a switching circuit for electrically connecting each of the bit lines its corresponding data line in response to a control signal, and conductive lines each electrically connected between a transistor and a capacitor of a memory cell selected from the plurality of memory cells and having a predetermined potential.

Owing to this arrangement, a semiconductor memory device can be realized wherein volatile memory cells and non-volatile memory cells are provided within a single memory cell array.

Further, the present application is disclosing other various inventions made to achieve the above objects and the inventions will be understood from the appended claims, respective embodiments and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 14 is a view illustrating a schematic layout of a semiconductor memory device according to a sixth embodiment of the present invention;

DETAILED DESCRIPTION OF THE PREFERRED EMBODIMENTS

Figure 1:
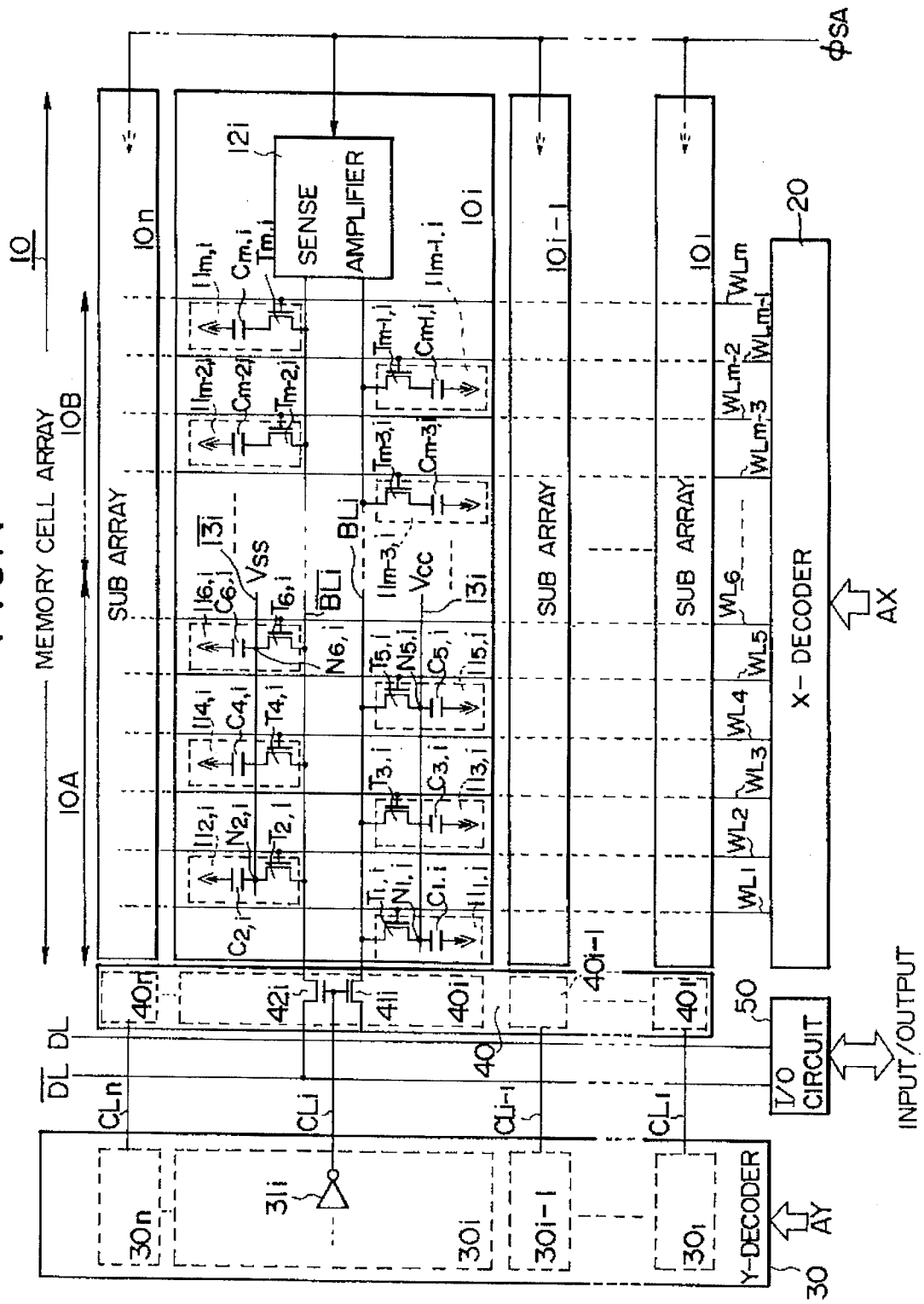
FIG. 1 is a circuit block diagram showing a principal part of a semiconductor memory device according to a first embodiment of the present invention.

Preferred embodiments of the present invention will hereinafter be described with reference to the accompanying drawings. In this case, respective elements of structure related directly to the present invention will be described below in detail.

A first embodiment of the present invention will first be described with reference to FIG. 1.

A semiconductor memory device according to the first embodiment comprises a memory cell array 10, an X decoder 20 for selecting a desired row from the memory cell array 10, a Y decoder 30 for selecting a desired column from the memory cell array 10, a pair of data lines DL, $\overline{DL}$, a transfer circuit 40 electrically connected between the pair of data lines DL and $\overline{DL}$ and the memory cell array 10, and an input/output circuit 50 electrically connected to the data line pair DL and $\overline{DL}$ and used to input data from and output the same to an external circuit.

The memory cell array 10 is made up of a plurality of subarrays $10_1$ through $10_n$ (where n is a natural number more than or equal to 2). Further, the memory cell array 10 comprises a DROM (DRAM and ROM) unit 10A comprised of memory cells which serve as a volatile memory (DRAM) and memory cells which serve as a non-volatile memory (ROM), and a DRAM unit 10B comprised of memory cells which serve as a volatile memory (DRAM).

A pair of complementary bit lines $BL_i$ and $\overline{BL_i}$ and a plurality of word lines $WL_1$ through $WL_m$ (where m is a natural number more than or equal to 2) are disposed within the subarray $10_i$ (where i is a natural number which falls within the range of 1 <i<n) so that they intersect with each other. One-transistor/one-capacitor type memory cells $11_{k,i}$ and $11_{k+1,i}$ are respectively electrically connected to points where the bit line pair $BL_i$ and $\overline{BL_i}$ and the word lines $WL_k$ and $WL_{k+1}$ (where k is an odd number which falls within the range of k<m-1) intersect respectively. The memory cell $11_{k,i}$ is made up of a capacitor $C_{k,i}$ and an n-channel transistor (hereinafter called an "NMOS") $T_{k,i}$ for the charge transfer. The capacitor $C_{k,i}$ is electrically connected between a node $N_{k,i}$ and a power source or supply having a fixed potential, i.e., a power supply HVcc having a potential Vcc/2 equal to half of a power supply potential (Vcc level) in the present embodiment. The NMOS $T_{k,i}$ is electrically connected between the node $N_{k,i}$ and either the bit line $BL_i$ or the bit line $\overline{BL_i}$. A gate electrode of the NMOS $T_{k,i}$ is electrically connected to the word line $WL_k$. The bit line pair $BL_i$ and $\overline{BL_i}$ is electrically connected to a sense amplifier $12_i$.

Figure 2:
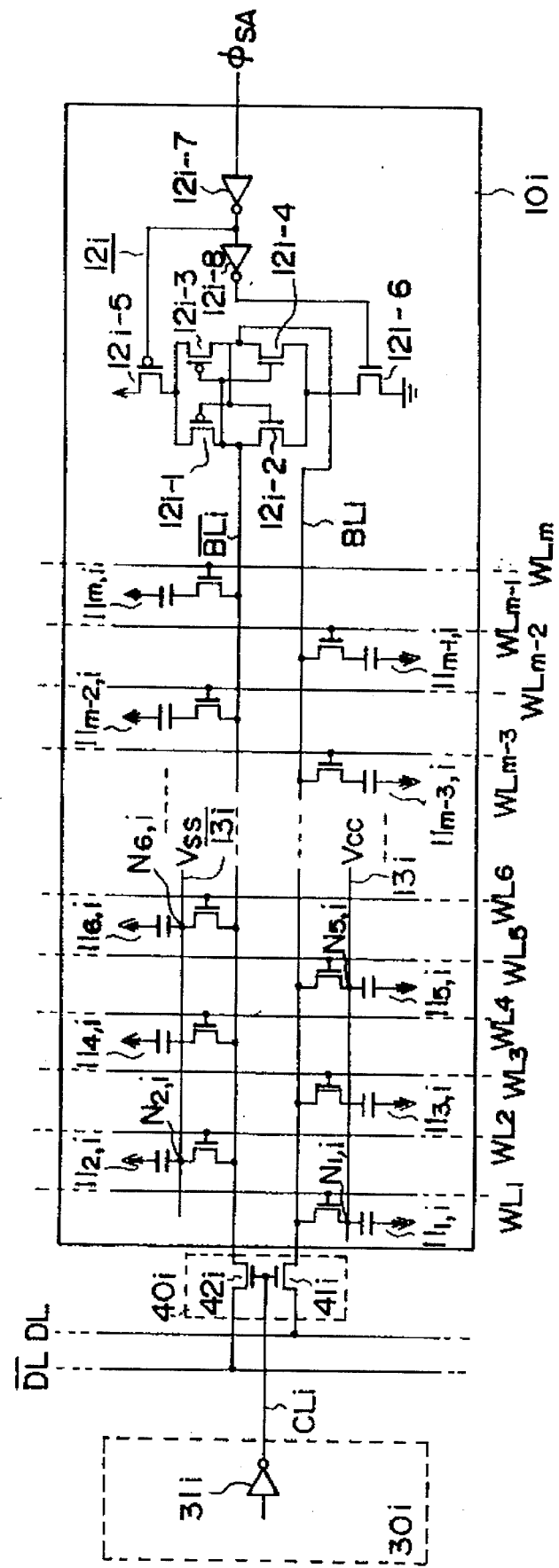
FIG. 2 is a circuit block diagram illustrating circuit configurations of a subarray and its peripheral portions both of which are employed in the semiconductor memory device shown in FIG. 1.

The sense amplifier $12_i$ is used to amplify a difference in potential between the pair of bit lines $BL_i$ and $\overline{BL_i}$. The sense amplifier $12_i$ is controlled based a sense-amplifier control signal øSA. A specific configuration of the sense amplifier $12_i$ is shown in FIG. 2. The sense amplifier $12_i$ has a P-channel MOS transistor (hereinafter called a "PMOS") $12_{i-1}$ and an NMOS $12_{i-2}$ whose gate electrodes are respectively electrically connected to the bit line $BL_i$, and a PMOS $12_{i-3}$ and an NMOS $12_{i-4}$ whose gate electrodes are respectively electrically connected to the bit line $\overline{BL_i}$. The PMOSs $12_{i-1}$ and $12_{i-3}$ and the NMOSs $12_{i-2}$ and $12_{i-4}$ are cross-coupled between the pair of bit lines $BL_i$ and $\overline{BL_i}$. Further, the sense amplifier $12_i$ has a PMOS $12_{i-5}$ electrically connected between a power source or supply Vcc having the power supply potential (Vcc level) and source electrodes of the PMOSs $12_{i-1}$ and $12_{i-2}$. Moreover, an NMOS $12_{i-6}$ is electrically connected between a power supply Vss having a ground potential (Vss level) and source electrodes of the NMOSs $12_{i-2}$ and $12_{i-4}$. The sense-amplifier control signal øSA is supplied to a gate electrode of the PMOS $12_{i-5}$ through an inverter $12_{i-7}$. The sense-amplifier control signal øSA is also delivered to the NMOS $12_{i-6}$ through series-connected inverters $12_{i-7}$ and $12_{i-8}$.

Further, a first conductive line $13_i$ having the same potential as the power supply potential (Vcc level) and a second conductive line $\overline{13_i}$ having the same potential as the ground potential (Vss level) are disposed in the DROM unit 10A of the subarray $10_i$. The memory cells, which store fixed data "1" (HIGH LEVEL) therein, of the memory cells serving as the ROM of the DROM unit 10A, i.e., memory cells $11_{1,i}$, $11_{2,i}$, $11_{5,i}$, $11_{6,i}$ in the present embodiment, are electrically connected to either the first conductive line $13_i$ or the second conductive line $\overline{13_i}$. Further, the memory cells, which store data "0" (LOW LEVEL) therein, of the memory cells serving as the ROM of the DROM unit 10A, i.e., memory cells $11_{3,i}$ and $11_{4,i}$ in the present embodiment are disconnected from either the first conductive lines $13_i$ or the second conductive line $\overline{13}_i$. The data written into the corresponding memory cells which serve as such a ROM can be arbitrarily set according to a user's demand depending on whether the memory cells are connected to or disconnected from the conductive lines.

In the present embodiment, the structure of the inside of the DROM unit 10A in the subarray $10_i$ is shown as an illustrative example. However, the structure of a DROM unit 10A provided in each of other subarrays can be suitably set according to the user's demand. The first conductive line $13_i$ is electrically connected to each of nodes $N_{1,i}$ and $N_{5,i}$ of the memory cells $11_{1,i}$ and $11_{5,i}$ of the DROM unit 10A in the subarray $10_i$. On the other hand, the second conductive line $\overline{13}_i$ is electrically connected to each of nodes $N_{2,i}$ and $N_{6,i}$ of the memory cells $11_{2,i}$ and $11_{6,i}$ of the DROM unit 10A in the subarray $10_i$.

The X decoder 20 decodes a series or sequence of X addresses AX supplied from the outside and selects a row from the memory cell array 10 based on the result of decoding. The X decoder 20 supplies a row selection signal to a word line for the row, which has been selected from the word lines $WL_1$ through $WL_m$.

The Y decoder 30 is made up of a plurality of unit Y decoders $30_1$ through $30_n$. The Y decoder 30 decodes a series or sequence of Y addresses AY supplied from the outside and selects a column from the memory cell array 10 based on the result of decoding. Further, the Y decoder 30 supplies a column selection signal to a column line for the column, which has been selected from column lines $CL_1$ through $CL_m$. The unit Y decoder $30_i$ is electrically connected to a unit transfer circuit $40_i$ of the transfer circuit 40 through an inverter $31_i$ so as to control the transfer circuit $40_i$.

The transfer circuit 40 is electrically connected between the pair of data lines DL and $\overline{DL}$ and the memory cell array 10. Further, the transfer circuit 40 transfers data on the bit line pair $BL_i$ and $\overline{BL}_i$ to the pair of data lines $DL_i$ and $\overline{DL}_i$ in response to the column selection signal. The transfer circuit 40 comprises unit transfer circuits $40_1$ through $40_n$ respectively controlled by the unit Y decoders $30_1$ through $30_n$. The unit transfer circuit $40_i$ is made up of an NMOS $41_i$ and an NMOS $42_i$ whose respective gate electrodes are electrically connected to the inverter $31_i$ of the unit Y decoder $30_i$. Further, a first electrode of the NMOS $41_i$ is electrically connected to the bit line $BL_i$, whereas a second electrode of the NMOS $41_i$ is electrically connected to the data line DL. A first electrode of the NMOS $42_i$ is electrically connected to the bit line $\overline{BL}_i$, whereas a second electrode of the NMOS $42_i$ is electrically connected to the data line $\overline{DL}$.

The pair of data lines DL and $\overline{DL}$ is electrically connected between the transfer circuit 40 and the input/output circuit 50 so as to effect the transfer of data therebetween.

The input/output circuit 50 is used to effect the input and output of data between the memory cell array 10 and the external circuit (not shown).

In the semiconductor memory device of the present invention as described above, the memory cell array is divided into the two parts, i.e., the DROM unit and the DRAM unit. The DROM unit 10A of the subarray in the memory cell array has the first conductive line $13_i$ and the second conductive line $\overline{13}_i$. Further, desired memory cells of the memory cells in the DROM unit 10A, that is, the memory cells, which serve as the memory cells of the ROM and each of which stores the fixed data "1" (HIGH LEVEL) therein, are electrically connected to either the first conductive line $13_i$ or the second conductive line $\overline{13}_i$. The data written into the above memory cells can be easily and arbitrarily set by bringing the memory cells into electrical contact with either the first conductive line or the second conductive line.

In the present embodiment, the first conductive line $13_i$ is electrically connected to each of the nodes $N_{1,i}$ and $N_{5,i}$ of the memory cells $11_{1,i}$ and $11_{5,i}$ of the DROM unit 10A in the subarray $10_i$. Such memory cells are defined as memory cells on the positive logic side. On the other hand, the second conductive line $\overline{13}_i$ is electrically connected to each of the nodes $N_{2,i}$ and $N_{6,i}$ of the memory cells $11_{2,i}$ and $11_{6,i}$ of the DROM unit 10A in the subarray $10_i$. Such memory cells are defined as memory cells on the negative logic side.

The term positive logic means that when the data input from the outside is of "1", the data "1" (High Level) is input to each memory cell. The action of writing data into each DRAM is normally effected on each of the memory cells electrically connected to the pair of bit lines $\overline{BL}$ and $\overline{BL}_i$. Therefore, the data input to each memory cell connected to the bit line $BL_i$ is different in logic from the data input to each memory cell connected to the remaining bit line $\overline{BL}_i$. When the data "1" is written from the outside in the present embodiment, for example, the data is supplied to the data line pair DL and $\overline{DL}$ from the input/output circuit 50. Further, the data "1" (High Level) is written into each of the memory cells $11_{1,i}$, $11_{3,i}$ and $11_{5,i}$ electrically connected to the bit line $BL_i$. Each memory cell in which the data having the same logic as that of the data input from the outside is written, is called a "memory cell" on the positive logic side.

On the other hand, the term negative logic means that when the data input from the outside is of "1", "0" (Low Level) is input to each memory cell. As described above, the action of writing the data into each DRAM is normally effected on the memory cells electrically connected to the bit line pair $\overline{BL}$ and $\overline{BL}_i$. Therefore, the data input to each memory cell connected to the one bit line $BL_i$ is different in logic from the data input to each memory cell connected to the other bit line $\overline{BL}_i$. When the data "1" is written from the outside in the present embodiment, for example, the data is supplied to the data line pair DL and $\overline{DL}$ from the input/output circuit 50. Further, the data "0" (Low Level) having a logic level opposite to that of the data "1" is written into each of the memory cells $11_{2,i}$, $11_{4,i}$ and $11_{6,i}$ electrically connected to the bit line $\overline{BL}_i$. Each memory cell in which the data having the logic opposite to that of the data input from the outside in this way is written, is called a "memory cell" on the negative logic side. Since, however, the reading of the data from each memory cell is performed through the same path as that employed upon writing the data into each memory cell even if the data "0" (Low level) is written into each memory cell on the negative logic side, the data "1(High Level) is read.

Figure 3:
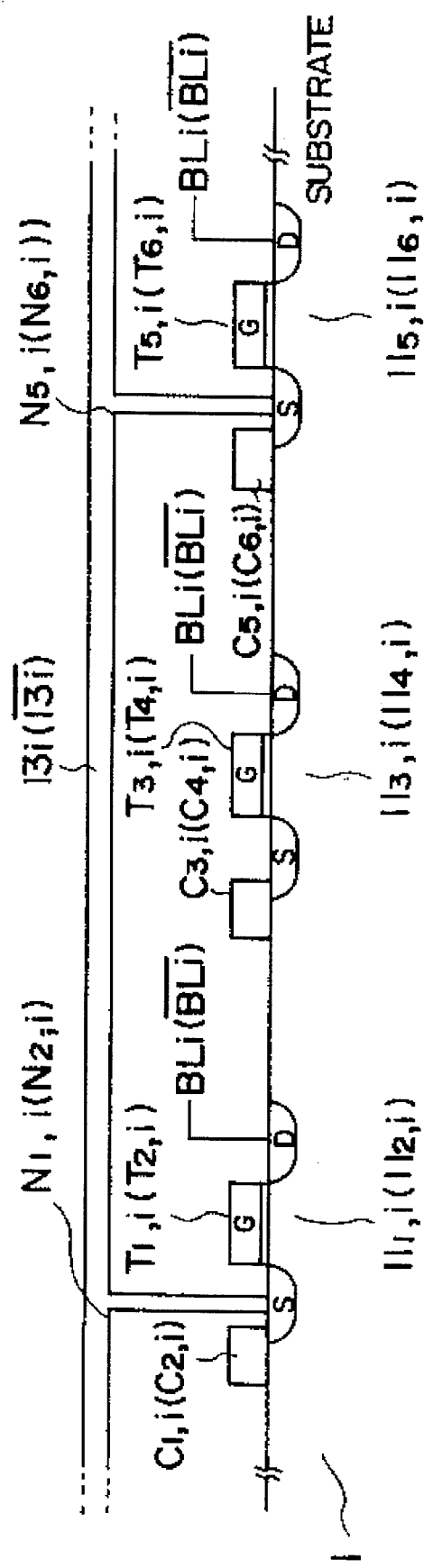
FIG. 3 is a schematic cross-sectional view depicting the principal part of the semiconductor memory device shown in FIG. 1.

Next, a fragmentary schematic cross-sectional view of the semiconductor memory device according to the present embodiment will be shown in FIG. 3. This drawing is shown to provide an easy understanding of the present invention. The same elements of structure as those shown in FIG. 1 are identified by like reference numerals. Since, in this case, the cross-section on the positive logic side is substantially identical to that on the negative logic side, they are simultaneously shown in FIG. 3. In the same drawing, symbols shown outside "( )" respectively correspond to memory cells on the positive logic side, whereas symbols shown inside "( )" respectively correspond to memory cells on the negative logic side. These memory cells are formed on a semiconductor substrate 1 and are respectively made up of the NMOSs and the capacitors as described above. Each of the NMOSs has a gate electrode G, a source electrode S and a drain electrode D. The source electrode of each NMOS is electrically connected to the capacitor C and the drain electrode thereof is electrically connected to its corresponding bit line. Further, the gate electrode of each NMOS is electrically connected to its corresponding word line (not shown). The desired memory cells $11_{1,i}$ and $11_{5,i}$ on the positive logic side, of these memory cells are respectively electrically connected to the first conductive line $13_i$ through the nodes $N_{1,i}$ and $N_{5,i}$. Similarly, the desired memory cells $11_{2,i}$ and $11_{6,i}$ on the negative logic side are respectively electrically connected to the second conductive line $\overline{13_i}$ through the nodes $N_{2,i}$ and $N_{6,i}$.

The operation of the semiconductor memory device will next be described with reference to FIGS. 4(A), 4(B) and 4(C). In this case, a description will be made of the operation for reading the data stored in the memory cells $11_{1,i}$, $11_{6,i}$ respectively electrically connected to the first and second conductive lines $13_i$, $\overline{13_i}$ through the nodes $N_{1,i}$ and $N_{6,i}$. The description of the operation is made for each period of t0 to t2. Each of the bit line pair and the data line pair is precharged to the potential Vcc/2 equal to half the power supply potential (Vcc level) before the period t0.

When the data "0" (Low level) is written into the memory cells $11_{3,i}$ and $11_{4,i}$ electrically disconnected from the first and second conductive lines $13_i$ and $\overline{13_i}$, the data "0" (Low level) is written into these memory cells immediately after the power supply has been turned on. The memory cells electrically connected to either the first conductive line $13_i$ or the second conductive line $\overline{13_i}$ are supplied with active electric charges through their corresponding conductive line. Thus, when a predetermined period has elapsed after the power supply has been turned on, the data is automatically written into each of these memory cells. The memory cells electrically disconnected from the conductive lines can store the data therein owing to a refresh operation of the DRAM.

The operation of each memory cell on the positive logic side, which is provided in the DROM Unit, will first be described with reference to FIG. 4(A).

<Period t0>

The sequence of X addresses AX are decoded by the X decoder 20 so that a word line $WL_1$ is selected. Next, the potential at the word line $WL_1$ changes from the Low Level to the High Level. When the word line $WL_1$ is selected, an NMOS $T_{1,i}$ in the memory cell $11_{1,i}$ is brought into an ON state. Thus, since the bit line $BL_i$ and the first conductive line $13_i$ having the power supply potential (Vcc level) are connected to each other, the bit line $BL_i$ is supplied with the electric charge through the first conductive line $13_i$ so that the potential at the bit line $BL_i$ is gradually raised. When the word line $WL_i$ is selected, the memory cells electrically connected to the word line $WL_1$, i.e., the memory cells $11_{1,i}$ through $11_{1,n}$ in this period are operated in the same manner as described above.

<Period t1>

When the sense-amplifier control signal øSA rises from the Low Level to the High Level, the sense amplifier $12_i$ starts operating. A small difference ΔV in potential between the pair of bit lines $BL_i$ and $\overline{BL_i}$ is amplified in response to the operation of the sense amplifier $12_i$. When the sense-amplifier control signal øSA rises, all the sense amplifiers $12_1$ through $12_n$ are operated so as to amplify differences in potential between other bit line pairs in the same manner as described above.

<Period t2>

Next, the sequence of Y addresses AY are decoded by the Y decoder 30 so that the column line $CL_i$ is selected. Thereafter, the column selection signal is supplied to the column line $CL_i$ from the unit Y decoder $30_i$ and the potential at the column line $CL_i$ changes from the Low level to the High Level. The unit transfer circuit $40_i$ is turned ON in response to the result of change and hence the bit line pair $BL_i$ and $\overline{BL_i}$ and the data line pair $\overline{DL_i}$ and $\overline{DL}$ are electrically connected to one another. Further, data read on each of the pair of bit lines $BL_i$ and $\overline{BL_i}$ is transferred to each of the pair of data lines $\overline{DL_i}$ and $\overline{DL}$. Afterwards, the read data is output to the outside through the input/output circuit 50. Since, at this time, the level of the bit line $BL_i$ is of the High Level and the level of the remaining bit line $\overline{BL_i}$ is of the Low level, the level of the data line DL becomes the High Level and the remaining data line $\overline{DL}$ becomes the Low Level. Therefore, the data output from the input/output circuit 50 is brought to the "1" (High Level).

Each memory cell on the negative logic side, which is provided in the DROM unit 10A, will next be described with reference to FIG. 4(B).

<Period t0>

The sequence of X addresses AX are decoded by the X decoder 20 so that a word line $WL_6$ is selected. Next, the potential at the word line $WL_6$ changes from the Low level to the High Level. When the word line $WL_6$ is selected, an NMOS $T_{6,i}$ of the memory cell $11_{6,i}$ is brought into the ON state. Thus, since the bit line $\overline{BL_i}$ and the second conductive line $\overline{13_i}$ having the ground potential (Vss level) are electrically connected to each other, the electric charge is discharged from the bit line $\overline{BL_i}$ to the second conductive line $\overline{13_i}$ so that the potential at the bit line $\overline{BL_i}$ is gradually reduced. When the word line $WL_6$ is selected, the memory cells electrically connected to the word line $WL_6$, i.e., the memory cells $11_{6,1}$ through $11_{6,n}$ in this period are operated in the same manner as described above.

<Period t1>

When the sense-amplifier control signal øSA rises from the Low Level to the High Level, the sense amplifier $12_i$ starts operating. A small difference ΔV in potential between the pair of bit lines $BL_i$ and $\overline{BL_i}$ is amplified in response to the operation of the sense amplifier $12_i$. When the sense-amplifier control signal øSA rises, all the sense amplifiers $12_1$ through $12_n$ are activated so as to amplify differences in potential between other bit line pairs in the same manner as described above.

<Period t2>

The sequence of Y addresses AY are next decoded by the Y decoder 30 so that a column line $CL_i$ is selected. Further, the column selection signal is supplied to the column line $CL_i$ from the unit Y decoder $30_i$ so that the potential at the column line $CL_i$ changes from the Low level to the High level. The unit transfer circuit $40_i$ is turned ON in response to the result Of change so that the bit line pair $BL_i$ and $\overline{BL_i}$ and the data line pair $\overline{DL_i}$ and $\overline{DL}$ are connected to one another. Data read on each of the pair of bit lines $BL_i$ and $\overline{BL_i}$ is transferred to each of the pair of data lines $\overline{DL_i}$ and $\overline{DL}$. Thereafter, the read data is output to the outside through the input/output Circuit 50. Since, at this time, the level of the bit line $BL_i$ is of the High Level and the level of the remaining bit line $BL_i$ is of the Low Level, the data line DL is brought to the High Level and the remaining data line $\overline{DL}$ is brought to the Low Level. Therefore, the data output from the input/output circuit 50 is brought to the "1" (High Level).

The operation of the DRAM unit will next be described with reference to FIG. 4(C). In this case, the operation for reading the data "0" is typically illustrated. That is, the operation of reading data from each memory cell in which the electric charge has not been stored, i.e., the data "0" (Low Level) has been stored is described.

<Period t0>

The sequence of X addresses AX are decoded by the X decoder 20 so that a word line $WL_m$ is selected. Next, the potential at the word line $WL_m$ changes from the Low level to the High Level. When the word line $WL_m$ is selected, an NMOS $T_{m,i}$ of a memory cell $11_{m,i}$ is brought into an ON state. Since a capacitor $C_{m,i}$ of the memory cell $11_{m,i}$ has no electric charge to be stored therein, the electric charge which has already charged or held on the bit line $BL_i$ (whose potential is Vcc/2), is discharged to the capacitor $C_{m,i}$. Therefore, the potential at the bit line $BL_i$ is reduced by a small potential ΔV from Vcc/2. When the word line $WL_m$ is selected, memory cells $11_{m,1}$ through $11_{m,n}$ each connected to the word line $WL_m$ perform the same operation as described above.

<Period t1>

Next, when the sense-amplifier control signal øSA rises from the Low Level to the High Level, the sense amplifier $12_i$ starts operating. A small difference ΔV in potential between the pair of bit lines $BL_i$ and $\overline{BL_i}$ is amplified in accordance with its operation. When the sense-amplifier control signal øSA rises, all the sense amplifiers $12_1$ through $12_n$ are operated so as to amplify differences in potential between other bit line pairs in the same manner as described above.

<Period t2>

Next, the sequence of Y addresses AY are decoded by the Y decoder 30 so that a column line $CL_i$ is selected. Further, the column selection signal is supplied to the column line $CL_i$ from the unit Y decoder $30_i$ so that the potential at the column line $CL_i$ changes from the Low level to the High level. The unit transfer circuit $40_i$ is turned ON in response to the result of change so that the bit line pair $BL_i$ and $\overline{BL_i}$ and the data line pair $\overline{DL_i}$ and $\overline{DL}$ are connected to one another. Data read on each of the pair of bit lines $BL_i$ and $\overline{BL_i}$ is transferred to each of the pair of data lines $\overline{DL_i}$ and $\overline{DL}$. Thereafter, the read data is output to the outside through the input/output circuit 50. Since, at this time, the level of the bit line $BL_i$ is of the Low Level and the level of the remaining bit line $\overline{BL_i}$ is of the High Level, the data line DL is brought to the Low Level and the remaining data line $\overline{DL}$ is brought to the High Level. Therefore, the data output from the input/output circuit 50 is brought to the "0" (High Level).

According to the semiconductor memory device of the present invention as described above, the memory cell array comprises the DROM (DRAM and ROM) unit 10A corresponding to a portion of a mixture of the memory cells for or serving as the volatile memory (DRAM) with the memory cells for or serving as the non-volatile memory (ROM), and the DRAM unit 10B comprised of the memory cells for the volatile memory (DRAM). The DROM unit 10A is provided with the first and second conductive lines $13_i$ and $13_i$. The memory cells for the ROM, for storing the data "1" (High Level) therein can be realized by bringing the memory cells into electrical contact with either the first conductive line $13_i$ or the second conductive line $\overline{13_i}$. On the other hand, the memory cells which are not brought into electrical contact with the first and second conductive lines, serve as those for the ROM, for storing the data "0" (Low level) therein. Further, such memory cells can also work as the memory cells used for the normal DRAM. Thus, the fixed data stored in each memory cell, i.e., the data "1" (High Level) stored in each of the memory cells electrically connected to either the first conductive line $13_i$ or the second conductive line $\overline{13_i}$ in the present embodiment is used as common data. The memory cells electrically disconnected from either the first conductive line $13_i$ or the second conductive line $\overline{13_i}$ may be said to store "variable date" since they are used under the operation of the normal DRAM in the same manner as the memory cells for the DRAM unit 10B by changing data stored therein in various ways. That is, the DRAM and the ROM are formed on the same memory cell array and the data in the ROM and the data in the DRAM are used in combination.

Now, consider that the semiconductor memory device of the present invention is actually used. Described specifically, the data opposite in logic level to the data stored in each of the memory cells for the ROM is uniformly written into each of memory cells other than the memory cells which electrically make contact with each conductive line and serve as the memory cells for the ROM. If 16-bit data is used, for example, then data "00" of the two rightmost bits is rewritten into data "11" as follows:

1000100111011000→1000100111011011

This type of semiconductor memory device can be used as for graphics, for example. A color that a user desires can be easily realized by rewriting a bit used to designate the color of a graphic into another, for example. It is difficult to rewrite the data stored in each memory cell of the ROM. In the semiconductor memory device of the present invention, however, the rewriting of the data can be freely made according to the demand of the user.

Figure 5:
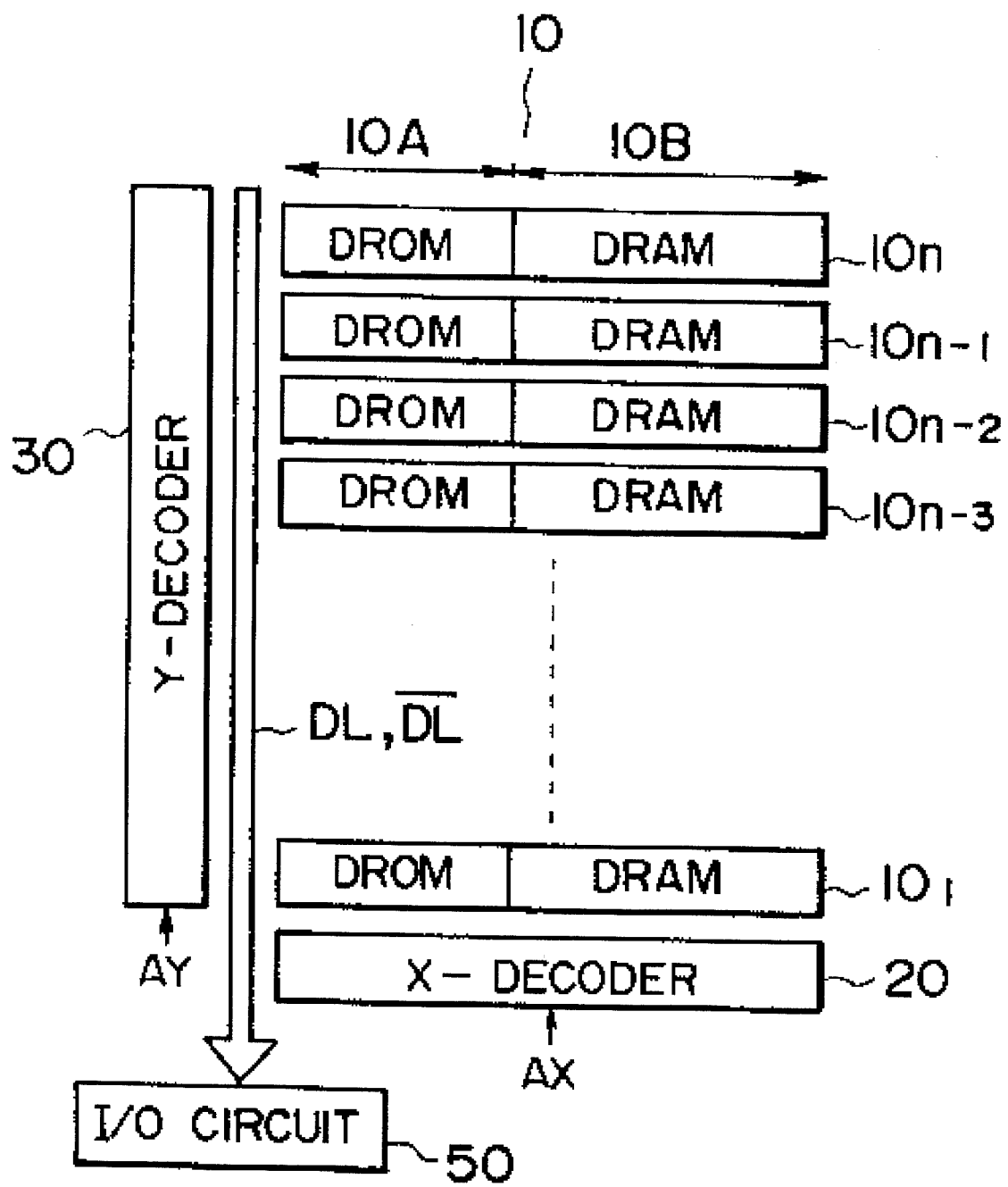
FIG. 5 is a view showing a schematic layout of the semiconductor memory device shown in FIG. 1.

As shown in FIG. 5, respective unit columns which constructs the memory cell array of the semiconductor memory device according to the above first embodiment are divided into two parts corresponding to the DROM unit and the DRAM unit in a word line direction. Therefore, the following advantageous effects can be brought about. A sequence of addresses AX are normally arranged in order in an ascending sequence starting from the lowest-order or lowest address. Therefore, the word lines are also arranged in ascending order of $WL_1$, $WL_2$, $WL_3$, . . . as shown in FIG. 1. When the data (data "0" in the present embodiment) opposite in logic level to the data (data "1" in the present embodiment) stored in each of the memory cells for the ROM is written into the DROM unit of the memory cell array employed in the present embodiment upon turning on the power supply as described above, the setting of the sequence of X addresses AX can be carried out by simply incrementing the addresses. The writing of the data into the DROM unit is carried out in order of the memory cells $11_{1,i}$, $11_{2,i}$, $11_{5,i}$, $11_{6,i}$, . . . electrically connected to the conductive lines in the DROM unit. Accordingly, the sequence of X addresses AX may be incremented over an address range from an address 0 to an X address corresponding to the maximum X address, for the word line electrically connected to each of the memory cells in the DROM unit, thereby making it possible to bring an advantageous effect that the control is easy.

Further, an image-processing DRAM called a "multiport memory" has a flashlight function. The flashlight function is of a function for writing data into all the memory cells electrically connected to a single word line, e.g., the memory cells $11_{1,1}$, $11_{1,2}$, . . . $11_{1,i}$, . . . , electrically connected to the word line $WL_1$ in the present embodiment. If the flashlight function is used, then data can be written into memory cells electrically connected to a desired word line in a short time. In this case, an advantage can be brought about in that the above DRAM cane be simplified in circuit operation if the address 0 through the X address n are produced by an address counter immediately after the power supply is turned on and they are initially set in accordance with the flashlight function when the memory cells for the DROM unit are electrically connected to the word lines $WL_1, \ldots$ corresponding to the sequence of X addresses AX.

In order to provide or obtain quick access to each memory cell like a page mode operation employed in the DRAM, the memory cell array is divided into the DROM unit and the DRAM unit in the word line direction of the semiconductor memory device according to the present embodiment where the sequence of Y addresses AY are incremented and the data are serially accessed while each word line remains in a rising state (in a High Level state). It is therefore possible to easily obtain successive access to the memory cells for the DROM and DRAM units.

The memory cells each storing the data "1" therein, which are provided in the DROM unit of the memory cell array of the semiconductor memory device according to the present embodiment, are electrically connected to either the first conductive line $13_i$ or the second conductive line $\overline{13}_i$. On the other hand, when the potential at the first conductive line is set as the ground potential (Vss level) and the potential at the second conductive line is set as the power supply potential (Vcc level), the data "0" can also be stored in each memory cell as the fixed data. At this time, for example, the data "1" is stored in the memory cell which is electrically disconnected from the conductive line and performs a dynamic operation (corresponding to the operation of the DRAM), e.g., the memory cell $11_{3,i}$. That is, the data "1" is written into each memory cell electrically disconnected from the conductive line immediately after the power supply is turned on. The so-written data "1" is held under the refresh operation of the DRAM.

Figure 6:
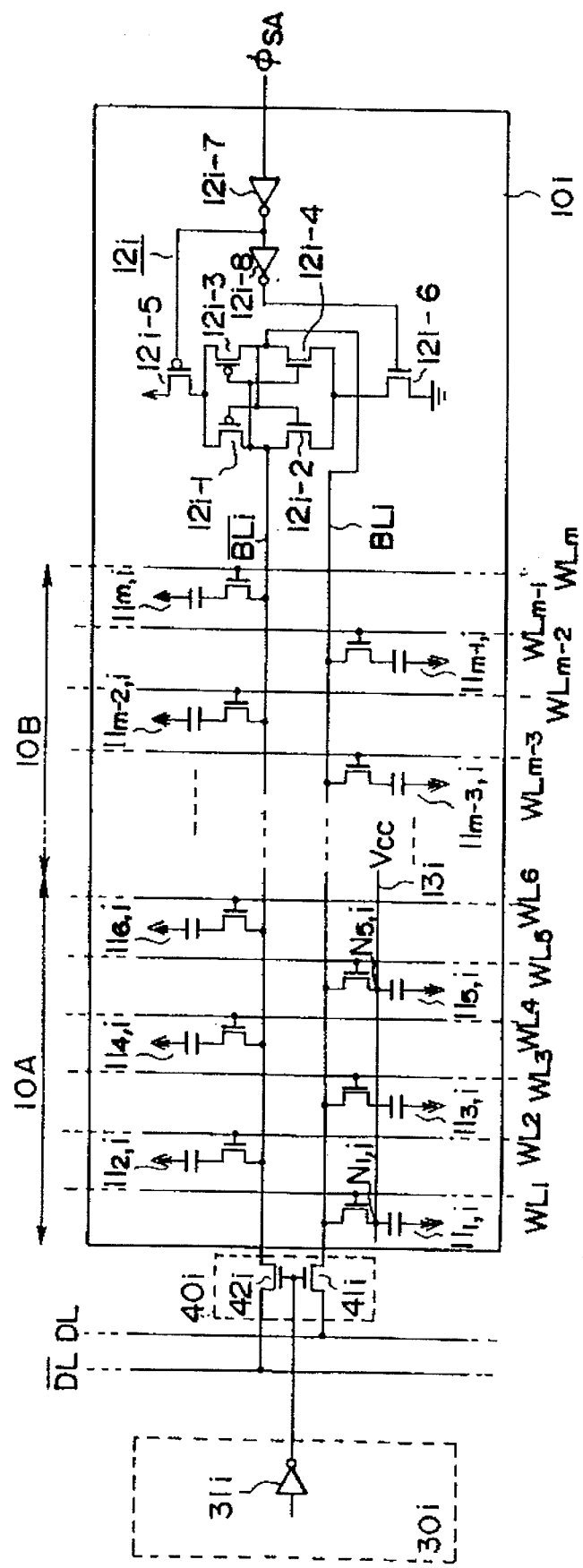
FIG. 6 is a fragmentary circuit block diagram showing circuit configurations of a subarray and its peripheral portions both of which are employed in a semiconductor memory device according to a second embodiment of the present invention.

A second embodiment of the present invention will next be described with reference to FIG. 6. The same elements of structure as those described in the first embodiment are identified by like reference numerals and their description will therefore be omitted.

A semiconductor memory device according to the second embodiment has a DROM unit and a DRAM unit provided in a memory cell array in a manner similar to that according to the first embodiment. In the semiconductor memory device according to the second embodiment, a conductive line $13_i$ is provided only on the positive logic side of the DROM unit. Further, memory cells $11_{1,i}$ and $d11_{5,i}$, which serve as memory cells for a ROM and each of which stores fixed data "1" therein, are electrically connected to the conductive line $13_i$ through nodes $N_{1,i}$ and $N_{5,i}$. The conductive line $13_i$ has a power supply potential (Vcc level).

Figure 4A:
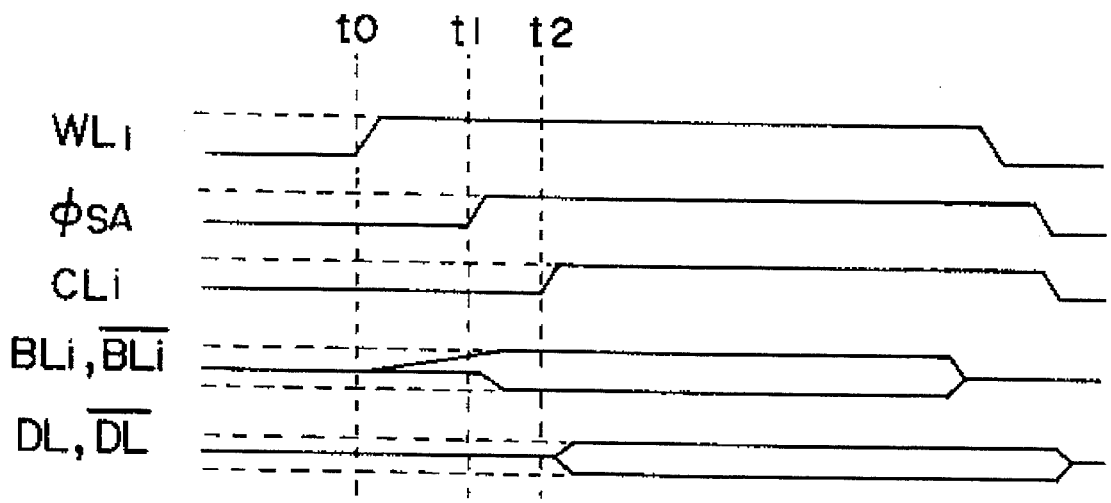
FIGS. 4(A), 4(B) and 4(C) are respectively partial timing diagrams for describing the operation of the semiconductor memory device shown in FIG. 1.

The operation of the semiconductor memory device according to the second embodiment is identical to that shown in FIG. 4(A). Its operation can be easily understood by reference to FIG. 4(A).

The semiconductor memory device according to the present embodiment is constructed in a manner similar to that according to the first embodiment. That is, memory cells which serve as the memory cells for the ROM are realized by providing the conductive line having the power supply potential within the DROM unit and bringing the conductive line into electrical contact with the memory cells. On the other hand, memory cells ($11_{2,i}$, $11_{3,i}$, . . . ), which are not brought into electrical contact with the conductive line, are activated as memory cells for the DRAM unit. Accordingly, the semiconductor memory device having high flexibility can be achieved by using data stored in each of the memory cells for the ROM as common data and rewriting data stored in each of other memory cells for the DRAM unit, which are not brought into electrical contact with the conductive line, into desired data. The semiconductor memory device according to the second embodiment can bring about the advantageous effect obtained by the semiconductor memory device according to the first embodiment.

Further, since the conductive line is provided only on the positive logic side of the DROM unit in the semiconductor memory device according to the present embodiment, the degree of freedom of the design at peripheral portions of the memory cells can be sufficiently taken.

Figure 7:
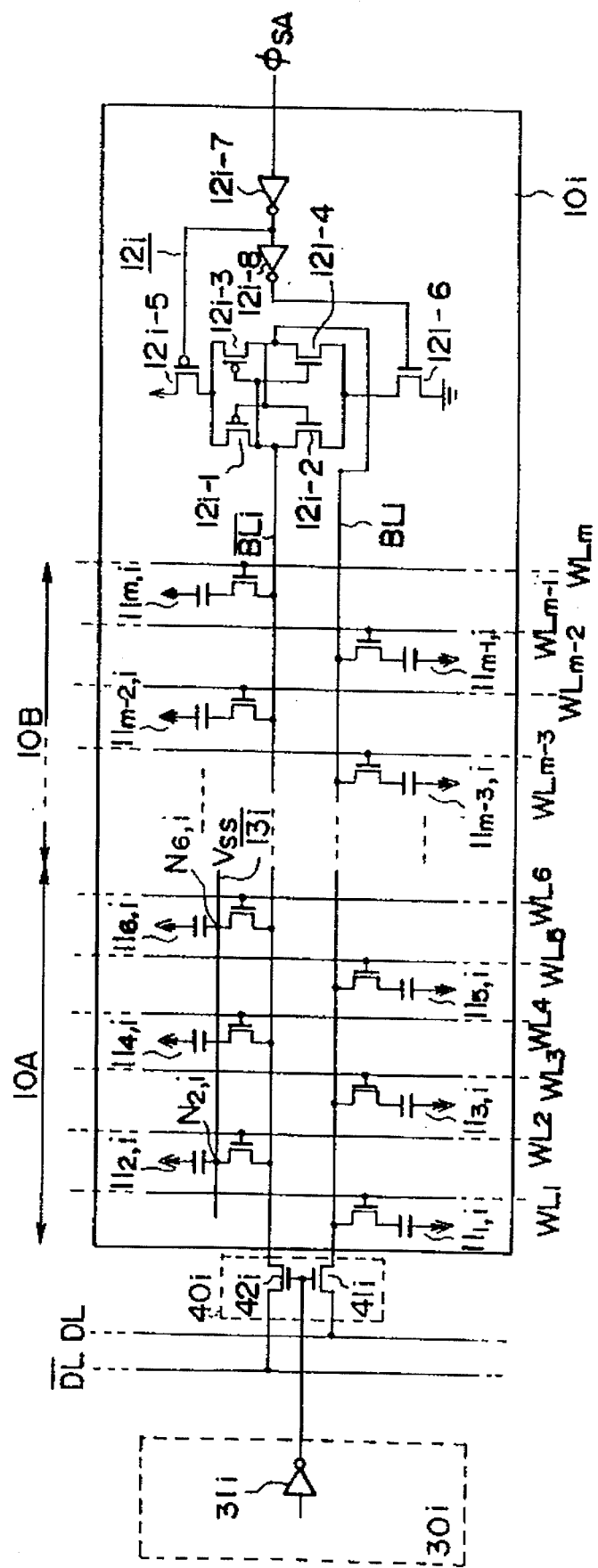
FIG. 7 is a fragmentary circuit block diagram illustrating circuit configurations of a subarray and its peripheral portions both of which are employed in a semiconductor memory device according to a third embodiment of the present invention.

A third embodiment of the present invention will next be described with reference to FIG. 7. in this case, the same elements of structure as those described in the first embodiment are identified by the same reference numerals and their description will therefore be omitted.

A semiconductor memory device according to the third embodiment is constructed in a manner similar to that according to each of the first and second embodiments. That is, a DROM unit and a DRAM unit are provided within a memory cell array. In the semiconductor memory device according to the third embodiment, a conductive line $\overline{13}_i$ is disposed only on the negative logic side of the DROM unit. Further, memory cells $11_{2,i}$ and $11_{6,i}$, which serve as memory cells for a ROM and each of which stores fixed data "1" therein, are electrically connected to the conductive line $\overline{13}_i$ through nodes $N_{2,i}$ and $N_{6,i}$. The conductive line $\overline{13}_i$ has a ground potential (Vss level).

Figure 4B:
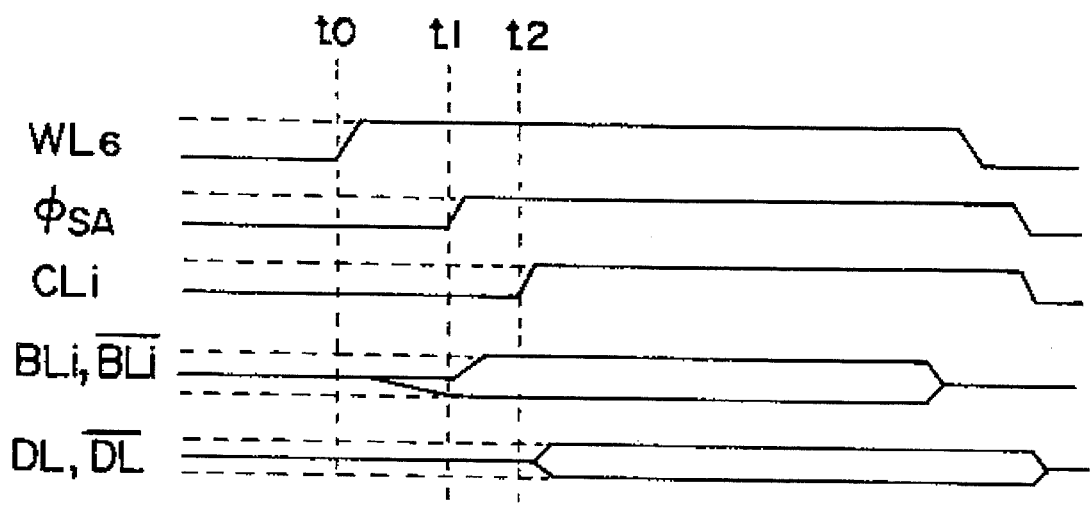
Figure 4C:
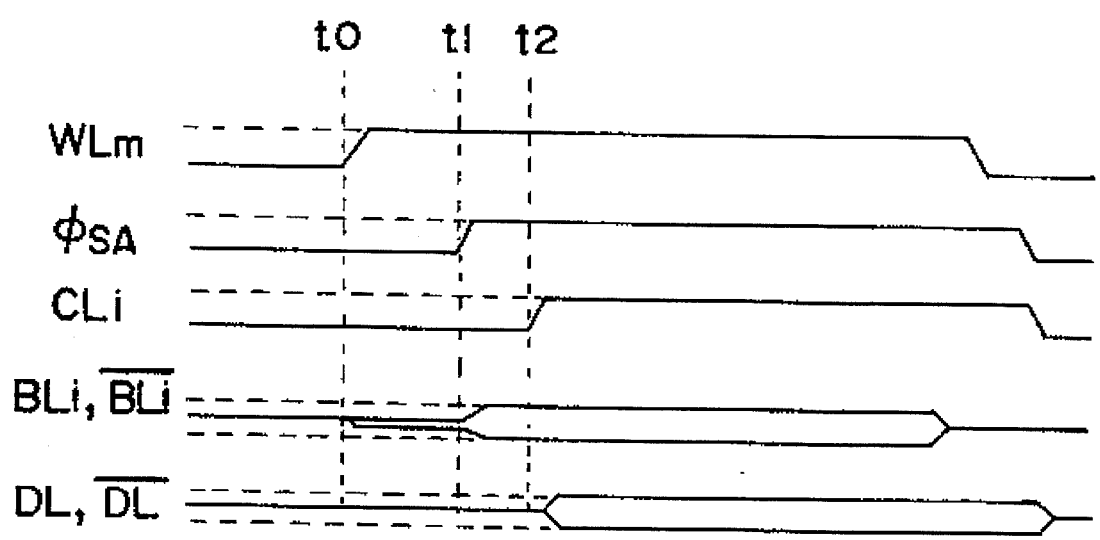

The operation of the semiconductor memory device according to the third embodiment is identical to that illustrated in FIG. 4(B) and can be easily understood by reference to FIG. 4(B).

In the semiconductor memory device according to the present embodiment, memory cells which serve as the memory cells for the ROM are realized by providing the conductive line having the ground potential within the DROM unit and bringing the conductive line into electrical contact with the memory cells. On the other hand, memory cells ($11_{1,i}$, $11_{3,i}$, . . . ), which are not brought into electrical contact with the conductive line, are activated as memory cells for the DRAM unit. Accordingly, the semiconductor memory device having high flexibility can be achieved by using data stored in each of the memory cells for the ROM as common data and rewriting data stored in each of other memory cells for the DRAM unit, which are not brought into electrical contact with the conductive line, into desired data. The semiconductor memory device according to the third embodiment can bring about the advantageous effect obtained by each of the semiconductor memory devices according to the first and second embodiments.

Further, since the conductive line is provided only on the negative logic side of the DROM unit in the semiconductor memory device according to the present embodiment, the degree of freedom of the design at peripheral portions of the memory cells can be sufficiently taken. An area on a chip, which is occupied by the memory cell array of the semiconductor memory device, is normally so large. Accordingly, a ground potential wire or conductor for electrically connecting a ground pad (GND) to peripheral circuits disposed on the side opposite to the ground pad is formed so as to greatly bypass the memory cell array or formed on the memory cell array. The conductive line employed in the present embodiment can also be commonly used for the ground potential conductor.

Figure 8:
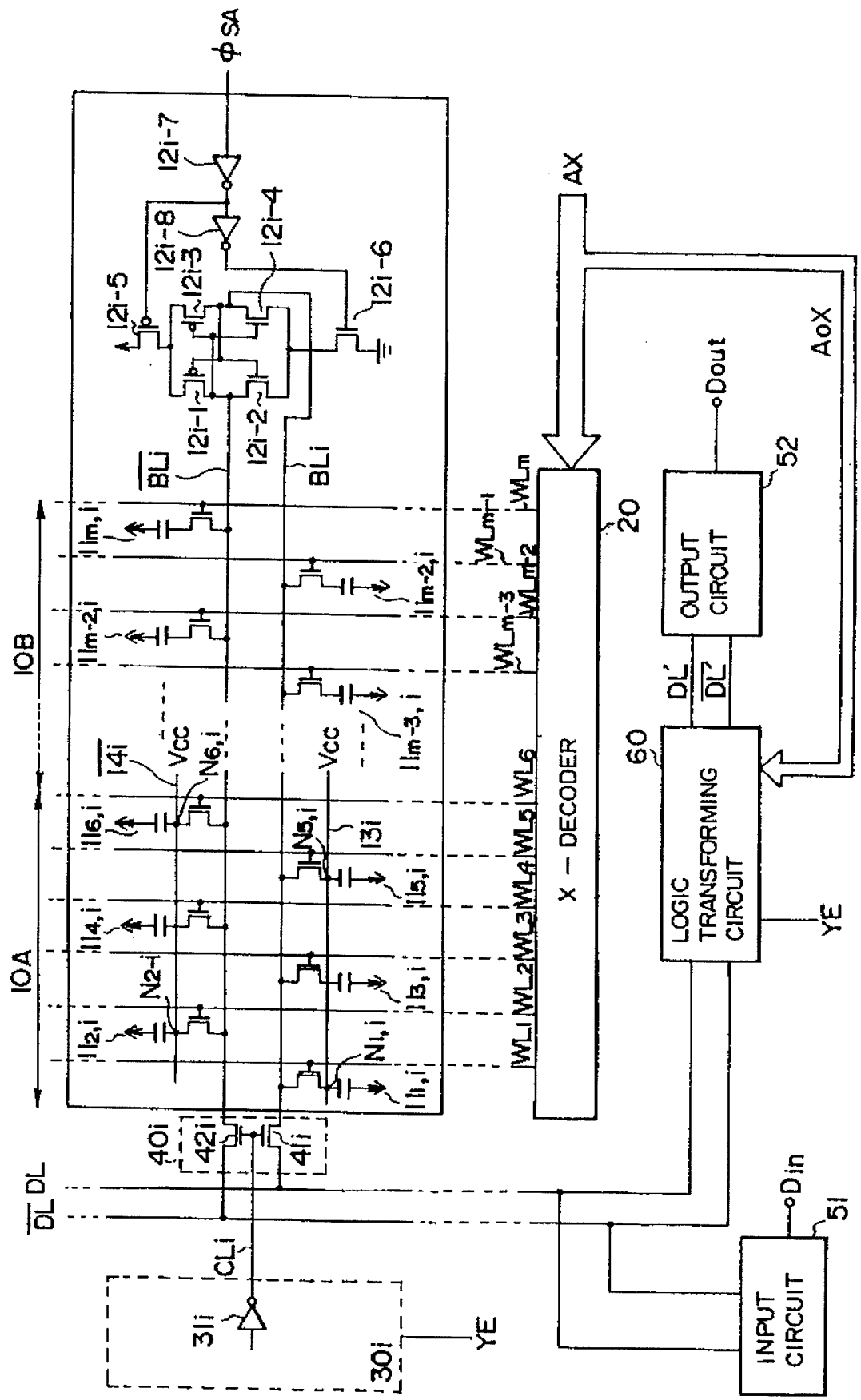
FIG. 8 is a fragmentary circuit block diagram depicting circuit configurations of a subarray and its peripheral portions, both of which are employed in a semiconductor memory device according to a fourth embodiment of the present invention.

A fourth embodiment of the present invention will next be described with reference to FIG. 8. In this case, the same elements of structure as those described in the first embodiment are identified by like reference numerals and their description will therefore be omitted.

In a semiconductor memory device according to the fourth embodiment, a first conductive line $13_i$ having a power supply potential (Vcc level) is provided on the positive logic side of a DROM unit 10A and a second conductive line $\overline{14_i}$ having the power supply potential (Vcc level) is provided on the negative logic side. The first conductive line $13_i$ is electrically connected to each of memory cells $11_{1,i}$ and $11_{5,i}$ through each of nodes $N_{1,i}$ and $N_{5,i}$. The second conductive line $\overline{14_i}$ is electrically connected to each of memory cells $11_{2,i}$ and $11_{6,i}$ through each of nodes $N_{2,i}$ and $N_{6,i}$. Each of the memory cells electrically connected to either the first conductive line or the second conductive line stores fixed data "1" therein. That is, these memory cells serve as memory cells for a ROM. Further, the semiconductor memory device according to the present embodiment comprises an input/output circuit 51 electrically connected between a pair of data lines DL and $\overline{DL}$ and an input terminal $D_{in}$, an output circuit 52 electrically connected to an output terminal $D_{out}$, and a logic converting circuit 60 electrically connected between the data line pair DL and $\overline{DL}$ and the output circuit 52.

The logic converting circuit 60 converts outputs produced from the memory cells $11_{2,i}$, $11_{4,i}$, $11_{6,i}$ ... provided on the negative logic side into outputs of opposite phase based on the lowest address A0X of a sequence of X addresses AX (A0X, $\overline{A0X}$ through AmX, $\overline{AmX}$), for example. Further, the logic converting circuit 60 outputs the result of conversion to the output circuit 52 through a pair of data lines DL' and $\overline{DL'}$.

Figure 9:
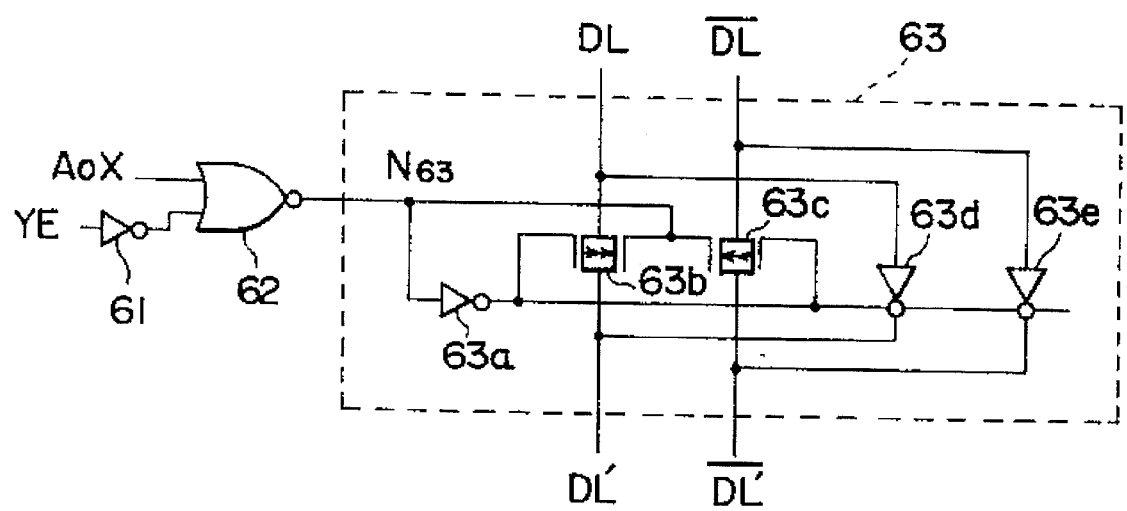
FIG. 9 is a circuit diagram showing the structure of a logic converting circuit of the semiconductor memory device shown in FIG. 8.

As shown in FIG. 9, the logic converting circuit 60 comprises an inverter 61 for inverting a logic of a Y decoder enable signal YE used to activate each unit Y decoder $30_i$, a NOR gate 62 for outputting the negative OR of both the output of the inverter 61 and the lowest address A0X therefrom, and a converting circuit 63 for inverting a logic on the data line pair DL and $\overline{DL}$ based on the output of the NOR gate 62 and outputting the result of inversion to the data line pair DL' and $\overline{DL'}$. The converting circuit 63 comprises a node $N_{63}$ electrically connected to the output of the NOR gate 62, an inverter 63a whose input terminal is electrically connected to the node $N_{63}$, a transfer gate 63b electrically connected between the data lines DL and $\overline{DL}$ and comprised of an NMOS and a PMOS turned on and off in response to the output produced from the NOR gate 62 and the output produced from the inverter 63a, a transfer gate 63c electrically connected between the data lines $\overline{DL}$ and $\overline{DL'}$ and comprised of an NMOS and a PMOS turned on and off in response to the outputs produced from the NOR gate 62 and the inverter 63a, and tristate inverters 63d and 63e respectively parallel-connected to the transfer gates 63b and 63c and turned on and off in response to the output produced from the inverter 63a. When data is read from each memory cell on the negative logic side, e.g., when the lowest address A0X is of a High Level, the data is transferred from a pair of bit lines $BL_i$ and $\overline{BL_i}$ to the data line pair DL and $\overline{DL}$. Further, the transferred data is transferred to the data line pair DL' and $\overline{DL'}$ through the tristate inverters 63d and 63e.

Figure 10A:
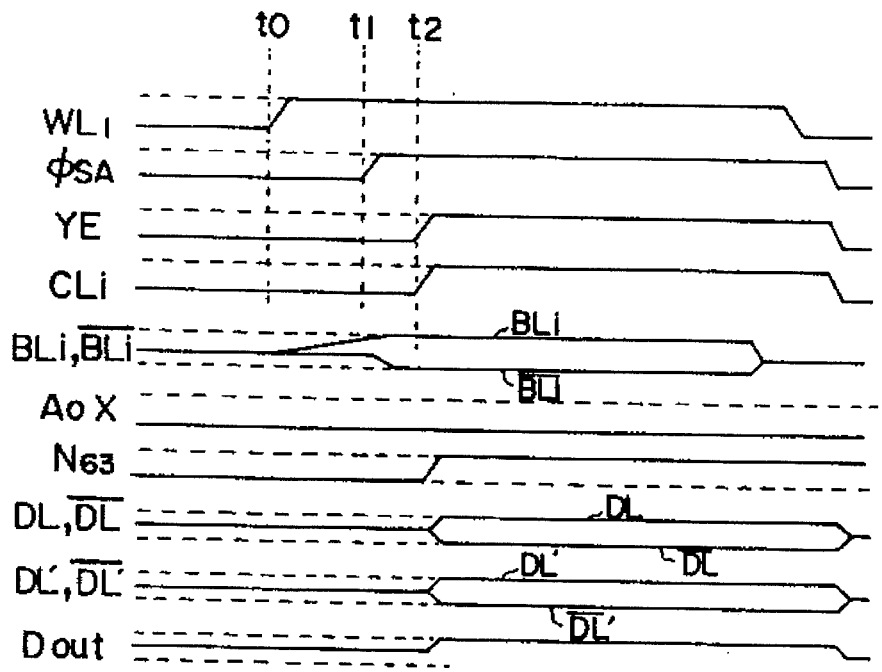
FIGS. 10(A) and 10(B) are respectively partial timing diagrams for describing the operation of the semiconductor memory device shown in FIG. 8.
Figure 10B:
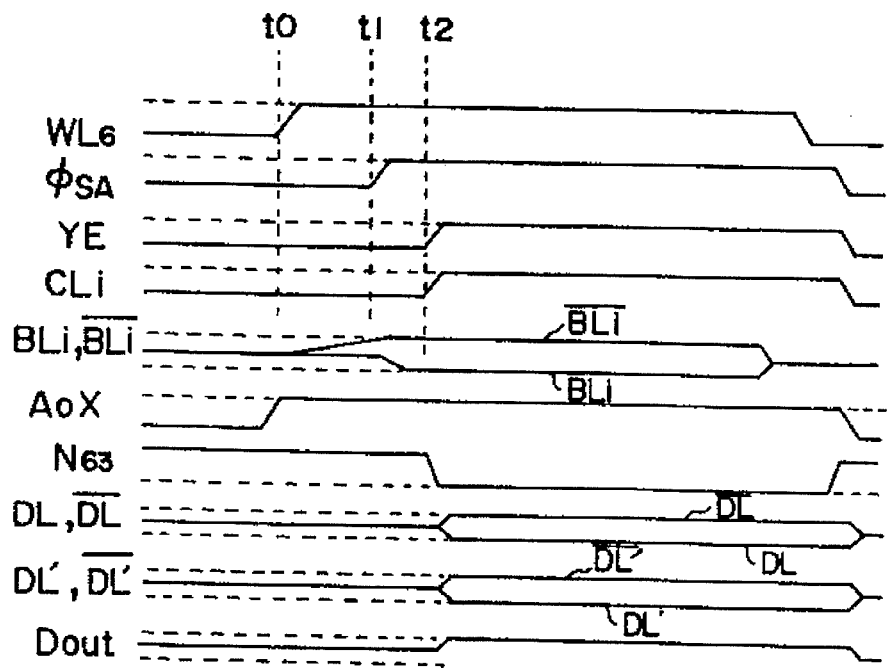

The operation of the semiconductor memory device according to the present embodiment will next be described with reference to FIGS. 10(A) and 10(B). FIG. 10(A) shows a timing for selecting a word line $WL_l$ and reading data stored in each memory cell on the positive logic side. FIG. 10(B) illustrates a timing for selecting a word line $WL_6$ and reading data stored in each memory cell on the negative logic side. In this case, the above operation will be described for each period of t0 through t2. Before the period t0, each of the bit line pair and the data line pair is precharged to a potential Vcc/2 equal to half the power supply potential (Vcc level).

Using FIG. 10(A), a description will first be made, as an example, a case where the data stored in each of the memory cells on the positive logic side is read.
<Period t0>

The sequence of X addresses AX are decoded by an X decoder 20 so that a word line $WL_1$ is selected. Next, the potential at the word line $WL_1$ changes from a Low level to a High Level. When the word line $WL_1$ is selected, an NMOS $T_{1,i}$ of the memory cell $11_{1,i}$ is brought into an ON state. Thus, since the bit line $BL_i$ and the first conductive line $13_i$ having the power supply potential (Vcc level) are connected to each other, the electric charge is supplied to the bit line $BL_i$ from the first conductive line $13_i$ so that the potential at the bit line $BL_i$ is gradually raised. When a word line $WL_i$ is selected, the memory cells electrically connected to the word line $WL_1$, i.e., the memory cells $11_{1,l}$ through $11_{1,n}$ in this period are operated in the same manner as described above.
<Period t1>

When a sense-amplifier control signal øSA rises from the Low Level to the High Level, a sense amplifier $12_i$ starts operating. A small difference ΔV in potential between the pair of bit lines $BL_i$ and $\overline{BL_i}$ is amplified in response to the operation of the sense amplifier $12_i$. When the sense-amplifier control signal øSA rises, all the sense amplifiers $12_1$ through $12_n$ are operated so as to amplify differences in potential between other bit line pairs in the same manner as described above.
<Period t2>

When the Y decoder enable signal YE rises from a Low Level to a High Level, a unit Y decoder $30_i$ of a Y decoder 30 is then activated. Further, a sequence of Y addresses AY are decoded by the Y decoder 30 so that a column line $CL_i$ is selected. Thereafter, a column selection signal is supplied to the column line $CL_i$ from the unit Y decoder $30_i$ so that the potential at the column line $CL_i$ changes from a Low level to a High Level. A unit transfer circuit $40_i$ is turned ON in response to the result of change and hence the bit line pair $BL_i$ and $\overline{BL_i}$ and the data line pair $\overline{DL_i}$ and $\overline{DL}$ are electrically connected to one another. Further, data read on each of the pair of bit lines $BL_i$ and $\overline{BL_i}$ is transferred to each of the pair of data lines $\overline{DL_i}$ and $\overline{DL}$.

At this time, the lowest address A0X of the sequence of X addresses AX is of a Low Level. Therefore, when the Y decoder enable signal YE changes from the Low level to the High Level, the potential at the node $N_{63}$ changes from the Low Level to the High Level. The transfer gates 63b and 63c are turned ON in response to this change. Accordingly, the data line pair DL and $\overline{DL}$ and the data line pair DL' and $\overline{DL'}$ are electrically connected to one another through the transfer gates 63b and 63c. As a result, the logic at the data line pair DL and $\overline{DL}$ is put in phase with that at the data line pair DL' and $\overline{DL'}$. Therefore, an output supplied to the output terminal $D_{out}$ from the output circuit 52 is brought to "1".

Using FIG. 10(B), a description will next be made, as an illustrative example, a case where the data stored in each of the memory cells on the negative logic side is read.
<Period t0>

The sequence of X addresses AX are decoded by the X decoder 20 so that a word line $WL_6$ is selected. Next, the potential at the word line $WL_6$ changes from the Low Level to the High Level. When the word line $WL_6$ is selected, an NMOS $T_{6,i}$ of the memory cell $11_{6,i}$ is brought into an ON state. Thus, since the bit line $\overline{BL_i}$ and the second conductive line $\overline{14}_i$ having the power supply potential (Vcc level) are electrically connected to one another, the electric charge is supplied to the bit line $\overline{BL}_i$ from the second conductive line $\overline{14}_i$ so that the potential at the bit line $\overline{BL}_i$ is gradually raised. When the word line $WL_6$ is selected, the memory cells electrically connected to the word line $WL_6$, i.e., the memory cells $11_{6,1}$ through $11_{6,n}$ in this period are operated in the same manner as described above.

<Period t1>

Next, when the sense-amplifier control signal øSA rises from the Low Level to the High Level, the sense amplifier $12_i$ starts operating. A small difference $\Delta V$ in potential between the pair of bit lines $BL_i$ and $\overline{BL}_i$ is amplified in response to the operation of the sense amplifier $12_i$. When the sense-amplifier control signal øSA rises, all the sense amplifiers $12_1$ through $12_n$ are operated so as to amplify differences in potential between other bit line pairs in the same manner as described above.

<Period t2>

When the Y decoder enable signal YE rises from the Low Level to the High Level, the unit Y decoder $30_i$ of the Y decoder 30 is then activated. Further, the sequence of Y addresses AY are decoded by the Y decoder 30 so as to select the column line $CL_j$. Thereafter, the column selection signal is supplied to the column line $CL_j$ from the unit Y decoder $30_i$ and hence the potential at the column line $CL_j$ changes from the Low level to the High Level. The unit transfer circuit $40_i$ is turned ON in response to the result of change and hence the bit line pair $BL_i$ and $\overline{BL}_i$ and the data line pair $\overline{DL}_i$ and $\overline{DL}$ are electrically connected to one another. Further, data read on each of the pair of bit lines $BL_i$ and $\overline{BL}_i$ is transferred to each of the pair of data lines $\overline{DL}_i$ and $\overline{DL}$. Since, in this case, the bit line $\overline{BL}_i$ on the negative logic side is of a High Level and the bit line $BL_i$ on the positive logic side is of a Low Level, the data line $\overline{DL}$ is brought to the High Level and the data line DL is brought to the Low Level. At this time, the lowest address A0X of the sequence of X addresses AX is of a High Level. Therefore, when the Y decoder enable signal YE changes from the Low level to the High Level, the potential at the node $N_{63}$ changes from the High Level to the Low Level in response to its change. Thus, the transfer gates 63b and 63c are turned OFF. Accordingly, the data line pair DL and $\overline{DL}$ and the data line pair DL' and $\overline{DL}'$ are electrically connected to one another through the inverters 63d and 63e. As a result, the logic at the data line pair DL and $\overline{DL}$ is put in out-of-phase with that at the data line pair DL' and $\overline{DL}'$. Therefore, an output supplied to the output terminal $D_{out}$ from the output circuit 52 is brought to "1".

Thus, the semiconductor memory device according to the fourth embodiment converts an output supplied from each of the memory cells $11_{2,i}, 11_{4,i}, 11_{6,i} \ldots$ on the negative logic side into an output of opposite phase based on the lowest address A0X of the sequence of X addresses AX (A0X, $\overline{A0X}$ through AmX, $\overline{AmX}$ and outputs it to the output terminal.

In the semiconductor memory device according to the fourth embodiment, the memory cells which serve as those for the ROM are realized by providing the conductive line having the power supply potential within the DROM unit and bringing the conductive line into electrical contact with the memory cells. On the other hand, the memory cells ($11_{2,i}, 11_{3,i}, \ldots$), which are not brought into electrical contact with the conductive line, are activated as the memory cells for the DRAM unit. Accordingly, the semiconductor memory device having high flexibility can be achieved by using the data stored in each of the memory cells for the ROM as common data and rewriting the data stored in each of other memory cells for the DRAM unit, which are not brought into electrical contact with the conductive line, into desired data. Since the semiconductor memory device has the conductive lines each having the power supply potential on the positive and negative logic sides of the DROM unit, the aforementioned logic converting circuit is provided therein. The provision of the logic converting circuit permits the use of the conductive lines having the potentials identical to each other. Accordingly, the semiconductor memory device according to the present embodiment can provide allowances for the design of peripheral portions of the memory cells in which the degree of freedom of the design is restricted.

The memory cells each storing data "1" therein, which are provided in the DROM unit of a memory cell array of the semiconductor memory device according to the present embodiment, are electrically connected to either the first conductive line $13_i$ or the second conductive line $\overline{14}_i$. On the other hand, when the potential at the first conductive line is set as a ground potential (Vss level), data "0" can also be stored in each memory cell as fixed data. At this time, for example, the data '1' is stored in the memory cell which is electrically disconnected from its corresponding conductive line and performs a dynamic operation (corresponding to the operation of the DRAM), e.g., the memory cell $11_{3,i}$. That is, the data "1" is written into each memory cell electrically disconnected from its corresponding conductive line immediately after the power supply is turned on. The so-written data "1" is held under the refresh operation of the DRAM.

Figure 11:
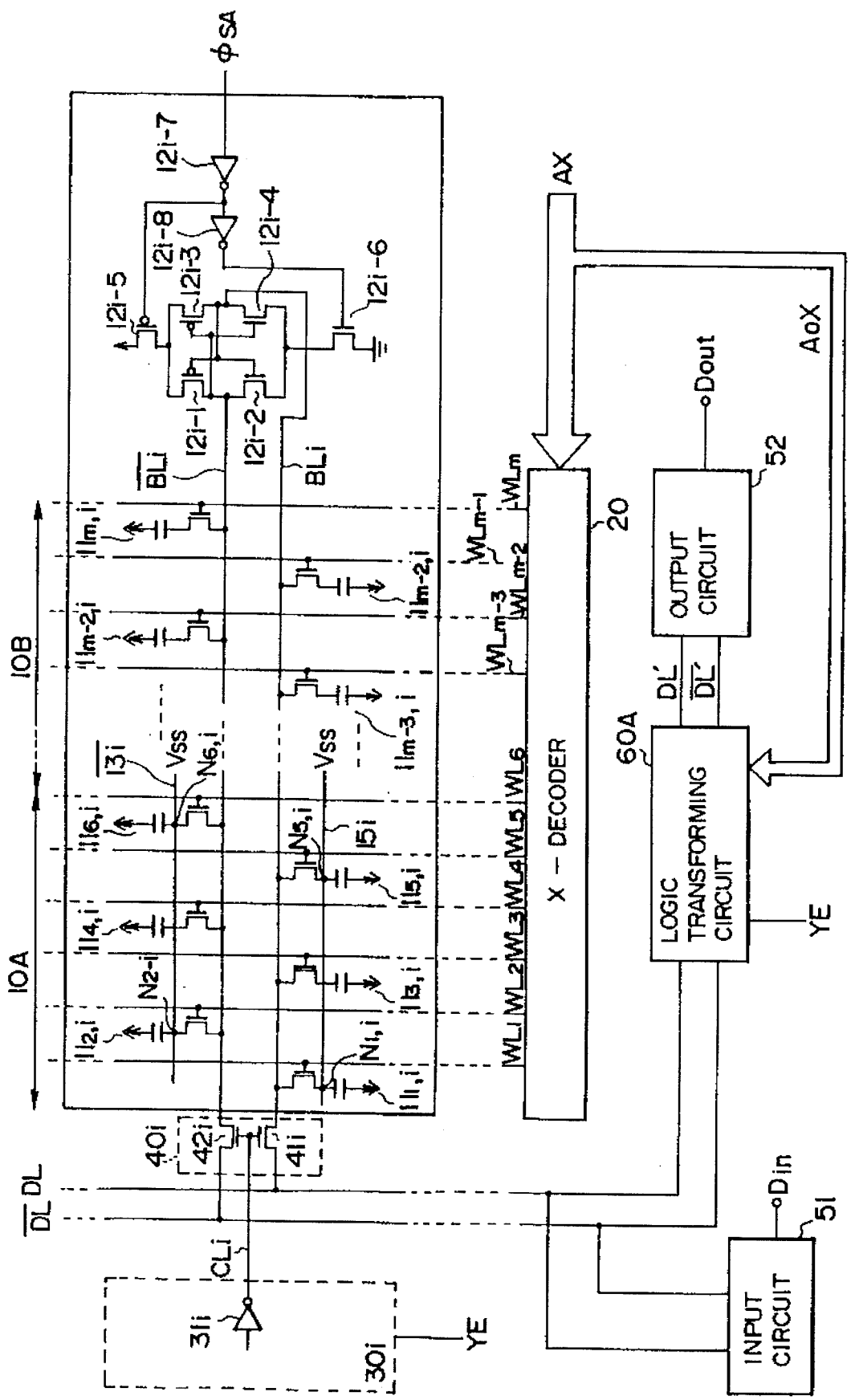
FIG. 11 is a fragmentary circuit block diagram illustrating circuit configurations of a subarray and its peripheral portions, both of which are employed in a semiconductor memory device according to a fifth embodiment of the present invention.

A fifth embodiment of the present invention will next be described with reference to FIG. 11. In this case, the same elements of structure as those described in the aforementioned embodiments are identified by like reference numerals and their description will therefore be omitted.

In a semiconductor memory device according to the fifth embodiment, a first conductive line $15_i$ having a ground potential (Vss level) is provided on the positive logic side of a DROM unit 10A and a second conductive line $\overline{13}_i$ having a ground potential (Vss level) is provided on the negative logic side. The first conductive line $15_i$ is electrically connected to each of memory cells $11_{1,i}$ and $11_{5,i}$ through each of nodes $N_{1,i}$ and $N_{5,i}$. The second conductive line $13_i$ is electrically connected to each of memory cells $11_{2,i}$ and $11_{6,i}$ through each of nodes $N_{2,i}$ and $N_{6,i}$. Each of the memory cells electrically connected to either the first conductive line or the second conductive line serves so as to store fixed data "1" therein. That is, these memory cells serve as memory cells for a ROM. Further, the semiconductor memory device according to the present embodiment comprises an input/output circuit 51 electrically connected between a pair of data lines DL and $\overline{DL}$ and an input terminal $D_{in}$, an output circuit 52 electrically connected to an output terminal $D_{out}$, and a logic converting circuit 60A electrically connected between the data line pair DL and $\overline{DL}$ and the output circuit 52. The logic converting circuit 60A converts outputs produced from the memory cells $11_{1,i}, 11_{3,i}, 11_{5,i} \ldots$ provided on the positive logic side into outputs of opposite phase based on the lowest-order or lowest address A0X of a sequence of X addresses AX (A0X, $\overline{A0X}$ through AmX, $\overline{AmX}$), for example. Further, the logic converting circuit 60A outputs the result of conversion to the output circuit 52 through a pair of data lines DL' and $\overline{DL}'$.

The logic converting circuit 60A converts outputs produced from the memory cells $11_{2,i}, 11_{4,i}, 11_{6,i} \ldots$ provided on the negative logic side into outputs of opposite phase based on the lowest-order or lowest address A0X of the sequence of X addresses AX (A0X, $\overline{A0X}$ through AmX, $\overline{AmX}$), for example. Further, the logic converting circuit 60A outputs the result of conversion to the output circuit 52 through the pair of data lines DL' and $\overline{DL'}$.

Figure 12:
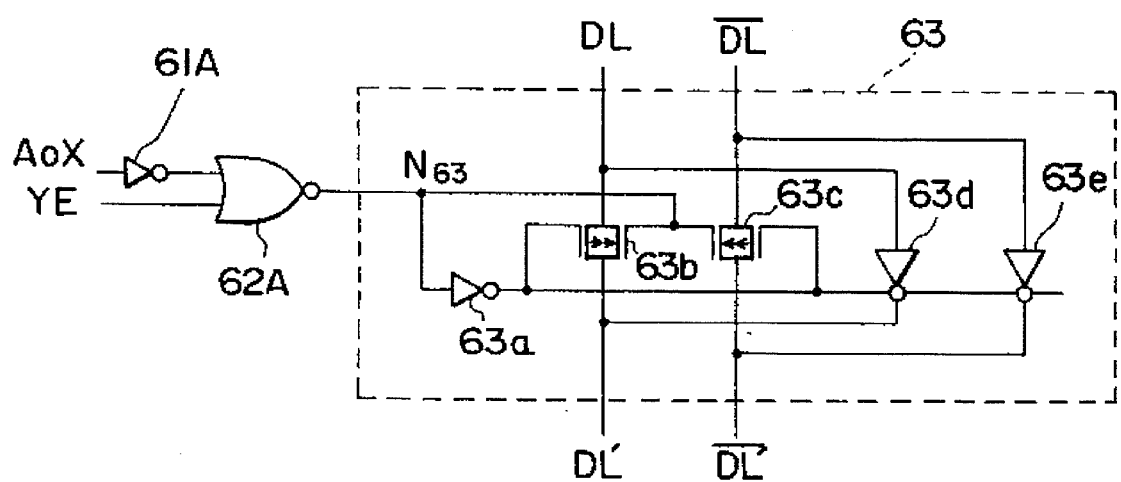
FIG. 12 is a circuit diagram showing the structure of a logic converting circuit of the semiconductor memory device shown in FIG. 11.

As shown in FIG. 12, the logic converting circuit 60A comprises an inverter 61A for inverting a logic of the lowest address A0X, a NOR gate 62A for outputting the negative OR of both the output of the inverter 61A and a Y decoder enable signal YE used to activate each unit Y decoder $30_i$, and a converting circuit 63 for inverting a logic on the data line pair DL and $\overline{DL}$ based on the output of the NOR gate 62A and outputting the result of inversion to the data line pair DL' and $\overline{DL'}$. The converting circuit 63 comprises a node $N_{63}$ electrically connected to the output of the NOR gate 62, an inverter 63a whose input terminal is electrically connected to the node $N_{63}$, a transfer gate 63b electrically connected between the data lines DL and DL' and comprised of an NMOS and a PMOS turned on and off in response to the output produced from the NOR gate 62 and the output produced from the inverter 63a, a transfer gate 63c electrically connected between the data lines $\overline{DL}$ and $\overline{DL'}$ and comprised of an NMOS and a PMOS turned on and off in response to the outputs produced from the NOR gate 62 and the inverter 63a, and tristate inverters 63d and 63e respectively parallel-connected to the transfer gates 63b and 63c and turned on and off in response to the output produced from the inverter 63a. When data is read from each memory cell on the negative logic side, e.g., when the lowest address A0X is of a High Level, the data is transferred from a pair of bit lines $BL_i$ and $\overline{BL_i}$ to the data line pair DL and $\overline{DL}$. Further, the transferred data is transferred to the data line pair DL' and $\overline{DL'}$ through the tristate inverters 63d and 63e.

Figure 13A:
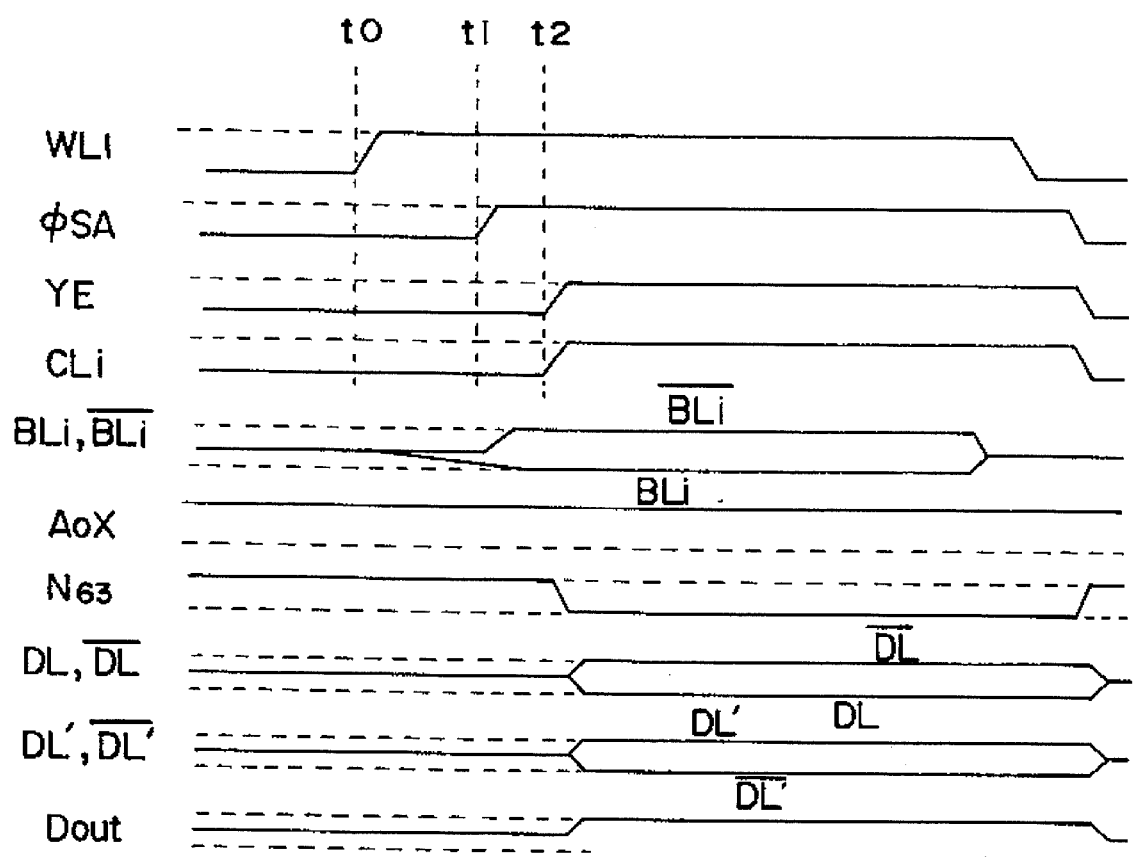
FIGS. 13(A) and 13(B) are respectively partial timing diagrams for describing the operation of the semiconductor memory device shown in FIG. 11.
Figure 13B:
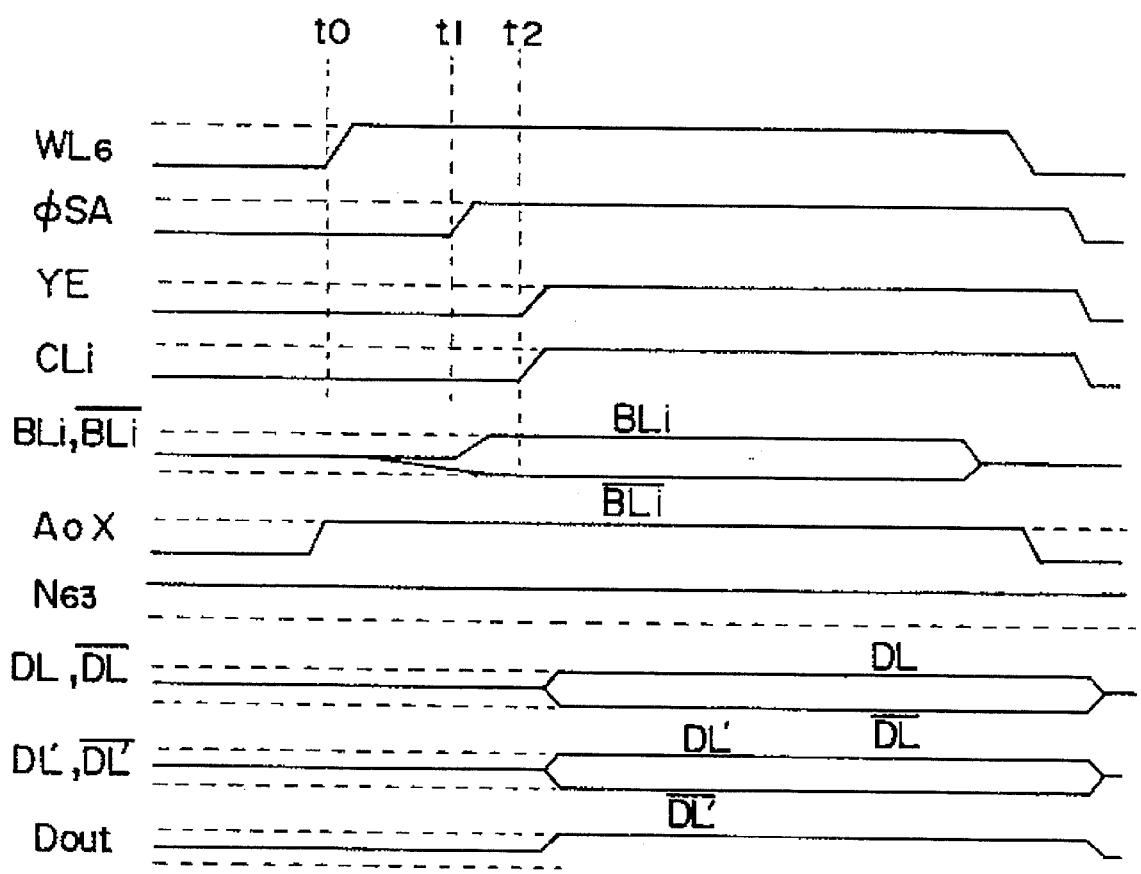

The operation of the semiconductor memory device according to the present embodiment will next be described with reference to FIGS. 13(A) and 13(B). FIG. 13(A) shows a timing for selecting a word line $WL_1$ and reading data (actually equivalent to negative logic data) stored in each memory cell on the positive logic side. FIG. 13(B) illustrates a timing for selecting a word line $WL_6$ and reading data (actually equivalent to positive logic data) stored in each memory cell on the negative logic side. In this case, the above operation will be described for each period of t0 through t2. Before the period t0, each of the bit line pair and the data line pair is precharged to a potential Vcc/2 equal to half the power supply potential (Vcc level).

Using FIG. 13(A), a description will first be made, as an example, a case where the data stored in each of the memory cells on the positive logic side is read.
<Period t0>

The sequence of X addresses AX are decoded by an X decoder 20 so that the word line $WL_1$ is selected. Next, the potential at the word line $WL_1$ changes from a Low level to a High Level. When the word line $WL_1$ is selected, an NMOS $T_{1,i}$ of the memory cell $11_{1,i}$ is brought into an ON state. Thus, since the bit line $BL_i$ and the first conductive line $15_i$ having the ground potential (Vss level) are connected to each other, the electric charge is discharged to the first conductive line $15_i$ from the bit line $BL_i$ so that the potential at the bit line $BL_i$ is gradually lowered. When a word line $WL_i$ is selected, the memory cells electrically connected to the word line $WL_1$, i.e., the memory cells $11_{1,1}$ through $11_{1,n}$ in this period are operated in the same manner as described above.
<Period t1>

When a sense-amplifier control signal øSA rises from a Low Level to a High Level, a sense amplifier $12_i$ starts operating. A small difference ΔV in potential between the pair of bit lines $BL_i$ and $\overline{BL_i}$ is amplified in response to the operation of the sense amplifier $12_i$. When the sense-amplifier control signal øSA rises, all the sense amplifiers $12_1$ through $12_n$ are operated so as to amplify differences in potential between other bit line pairs in the same manner as described above.
<Period t2>

When the Y decoder enable signal YE rises from a Low Level to a High Level, a unit Y decoder $30_i$ of a Y decoder 30 is then activated. Further, a sequence of Y addresses AY are decoded by the Y decoder 30 so as to select a column line $CL_i$. Thereafter, a column selection signal is supplied to the column line $CL_i$ from the unit Y decoder $30_i$ and hence the potential at the column line $CL_i$ changes from a Low level to a High Level. A unit transfer circuit $40_i$ is turned ON in response to the result of change so that the bit line pair $BL_i$ and $\overline{BL_i}$ and the data line pair $\overline{DL_i}$ and $\overline{DL}$ are electrically connected to one another. Further, data read on each of the pair of bit lines $BL_i$ and $\overline{BL_i}$ is transferred to each of the pair of data lines $\overline{DL_i}$ and $\overline{DL}$.

At this time, the lowest address A0X of the sequence of X addresses AX is of the High Level. Therefore, when the Y decoder enable signal YE changes from the Low level to the High Level, the potential at the node $N_{63}$ changes from the High Level to the Low level. Thus, the transfer gates 63b and 63c are turned ON. Further, the tristate inverters 63d and 63e are also turned OFF. Accordingly, the data line pair DL and $\overline{DL}$ and the data line pair DL' and $\overline{DL'}$ are electrically connected to one another through the transfer gates 63b and 63c. As a result, the logic at the data line pair DL and $\overline{DL}$ is out of phase with that at the data line pair DL' and $\overline{DL'}$. Therefore, an output supplied to the output terminal $D_{out}$ from the output circuit 52 is brought to "1".

Using FIG. 13(B), a description will next be made, as an illustrative example, a case where the data stored in each of the memory cells on the negative logic side is read.
<Period t0>

The sequence of X addresses AX are decoded by the X decoder 20 so that the word line $WL_6$ is selected. Next, the potential at the word line $WL_6$ changes from the Low Level to the High Level. When the word line $WL_6$ is selected, an NMOS $T_{6,i}$ of the memory cell $11_{6,i}$ is brought into an ON state. Thus, since the bit line $\overline{BL_i}$ and the second conductive line $\overline{13_i}$ having the ground potential (Vss level) are electrically connected to one another, the electric charge on the bit line $\overline{BL_i}$ is discharged to the second conductive line $\overline{13_i}$ so that the potential at the bit line $\overline{BL_i}$ is gradually lowered. When the word line $WL_6$ is selected, the memory cells electrically connected to the word line $WL_6$, i.e., the memory cells $11_{6,1}$ through $11_{6,n}$ in this period are operated in the same manner as described above.
<Period t1>

Next, when the sense-amplifier control signal øSA rises from the Low Level to the High Level, the sense amplifier $12_i$ starts operating. A small difference ΔV in potential between the pair of bit lines $BL_i$ and $\overline{BL_i}$ is amplified in response to the operation of the sense amplifier $12_i$. When the sense-amplifier control signal øSA rises, all the sense amplifiers $12_1$ through $12_n$ are operated so as to amplify differences in potential between other bit line pairs in the same manner as described above.
<Period t2>

When the Y decoder enable signal YE rises from the Low Level to the High Level, the unit Y decoder $30_i$ of the Y decoder 30 is then activated. Further, the sequence of Y addresses AY are decoded by the Y decoder 30 so as to select the column line $CL_i$. Thereafter, the column selection signal is supplied to the column line $CL_i$ from the unit Y decoder $30_i$ and hence the potential at the column line $CL_i$ changes from the Low level to the High Level. The unit transfer circuit $40_i$ is turned ON in response to the result of change and hence the bit line pair $BL_i$ and $\overline{BL_i}$ and the data line pair $\overline{DL_i}$ and $\overline{DL}$ are electrically connected to one another. Further, data read on each of the pair of bit lines $BL_i$ and $\overline{BL_i}$ is transferred to each of the pair of data lines $\overline{DL_i}$ and $\overline{DL}$.

Since, in this case, the bit line $\overline{BL_i}$ on the positive logic side is of a High Level and the bit line $BL_i$ on the negative logic side is of a Low Level, the data line DL is brought to a High Level and the data line $\overline{DL}$ is brought to a Low Level. At this time, the lowest address A0X of the sequence of X addresses AX is of a High Level. Therefore, when the Y decoder enable signal YE changes from the Low level to the High Level, the potential at the node $N_{63}$ is brought to the High Level in response to its change. Thus, the transfer gates 63b and 63c are turned ON and the tristate inverters 63d and 63e are turned OFF. In doing so, the data line pair DL and $\overline{DL}$ and the data line pair DL' and $\overline{DL'}$ are electrically connected to one another through the transfer gates 63b and 63c. As a result, the logic at the data line pair DL and $\overline{DL}$ is put in phase with that at the data line pair DL' and $\overline{DL'}$. Therefore, an output supplied to the output terminal $D_{out}$ from the output circuit 52 is brought to "1".

In the semiconductor memory device according to the fifth embodiment, the memory cells which serve as those for the ROM are realized by providing the conductive line having the ground potential within the DROM unit and bringing the conductive line into electrical contact with the memory cells. On the other hand, the memory cells ($11_{2,i}$, $11_{3,i}$, ...), which are not brought into electrical contact with the conductive line, are activated as the memory cells for the DRAM unit. Accordingly, the semiconductor memory device having high flexibility can be materialized by using the data stored in each of the memory cells for the ROM as common data and rewriting the data stored in each of other memory cells for the DRAM unit, which are not brought into electrical contact with the conductive line, into desired data. Since the semiconductor memory device has the conductive lines each having the ground potential on the positive and negative logic sides, the aforementioned logic converting circuit is provided therein. The provision of the logic converting circuit permits the use of the conductive lines having the potentials identical to each other. Accordingly, the semiconductor memory device according to the present embodiment can provide allowances for the design of peripheral portions of the memory cells in which the degree of freedom of the design is restricted.

The memory cells each storing data "1" therein, which are provided in the DROM unit of a memory cell array of the semiconductor memory device according to the present embodiment, are electrically connected to either the first conductive line $15_i$ or the second conductive line $\overline{13_i}$. At this time, for example, the data "1' is stored in the memory cell which is electrically disconnected from its corresponding conductive line and performs a dynamic operation (corresponding to the operation of the DRAM), e.g., the memory cell $11_{3,i}$. That is, the data "1" is written into each memory cell electrically disconnected from its corresponding conductive line immediately after the power supply is turned on. The so-written data "1" is held under the refresh operation of the DRAM.

A sixth embodiment of the present invention will next be described with reference to FIG. 14. FIG. 14 is a view illustrating a schematic layout of a semiconductor memory device according to the sixth embodiment. In this case, the same elements of structure as those which have already been used above, are identified by like reference numerals and their description will therefore be omitted.

DROM units 10A-1 and 10A-2 and DRAM units 10B-1 and 10B-2 are alternately disposed in each of subarrays $10_{1-1}$ through $10_{n-1}$ of a memory cell array 10-1 in the semiconductor memory device according to the present embodiment. The memory cell array of the semiconductor memory device according to the present embodiment is divided into four in this way. The memory cell array of the semiconductor memory device is selected by an X decoder 20 and a Y decoder 30 in a manner similar to the aforementioned semiconductor memory device. Incidentally, the present embodiment shows, as an illustrative example, the case where the memory cell array is divided into the four. It will however be understood by reference to the present embodiment that the memory cell array can be divided into three or more.

The operation of the semiconductor memory device according to the present embodiment will be easily understood from that of the semiconductor memory device according to the first embodiment.

The semiconductor memory device according to the present embodiment can bring about the following advantageous effects as well as the same advantageous effect as that obtained by the semiconductor memory device according to the first embodiment.

When a semiconductor memory device normally performs a serial access operation, a sequence of X addresses AX are incremented so as to effect the serial access operation. If the semiconductor memory device according to the present embodiment is used in such a case, then RAM data can be written into a sequence of serial read data like "ROM data→input data→ROM data" upon executing a serial read operation, for example. That is, the previously-written data can be inserted into an intermediate position between the already-written ROM data as the RAM data. This can be used in data processing executed by a system controlled by a CPU (Central Processing Unit). If the semiconductor memory device according to the present embodiment is employed in a voice or speech synthesizer, then a user's voice can be inserted between voices made or produced based on the ROM data.

If the layout of the semiconductor memory device according to the present embodiment is applied to each of the semiconductor memory devices according to the first through fifth embodiments referred to above, then the aforementioned advantageous effects can be brought about.

Figure 15:
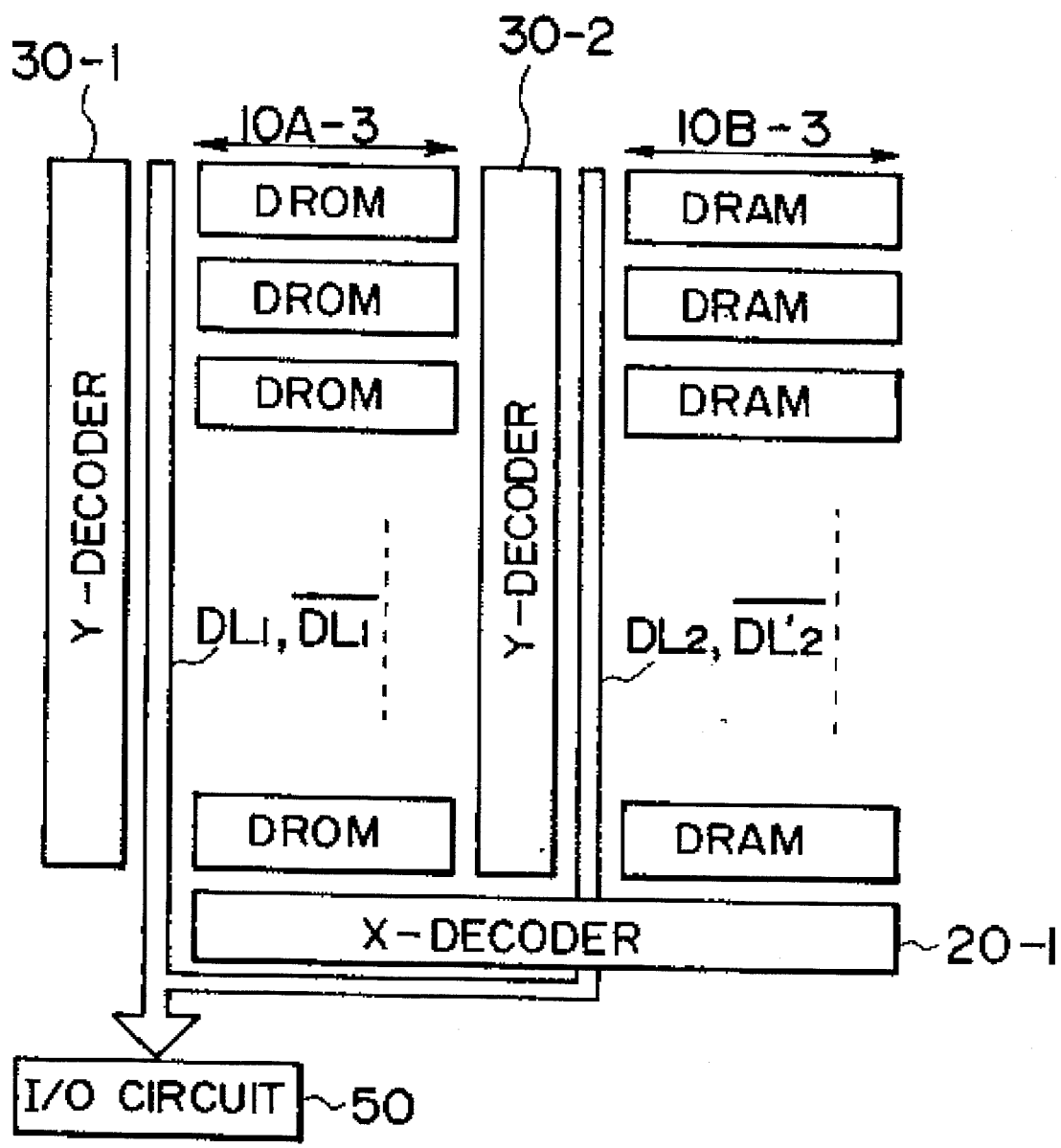
FIG. 15 is a view showing a schematic layout of a semiconductor memory device according to a seventh embodiment of the present invention.

A seventh embodiment of the present invention will next be described with reference to FIG. 15. FIG. 15 is a view illustrating a schematic layout of a semiconductor memory device according to the seventh embodiment. In this case, the same elements of structure as those shown above are identified by like reference numerals and their description will therefore be omitted.

A memory cell array employed in the semiconductor memory device according to the present embodiment is divided into a DROM unit 10A-3 and a DRAM unit 10B-3 for each subarray. A Y decoder 30-1 is provided so as to correspond to the DROM unit 10A-3 and a Y decoder 30-2 is provided so as to correspond to the DRAM unit 10B-3. One of word lines WL provided within the memory cell array is selected by an X decoder 20-1. Further, each bit line pair provided in the DROM unit 10A-3 is electrically connected to a data line pair $DL_1$ and $\overline{DL_1}$ through a transfer circuit 40-1. Each bit line pair provided in the DRAM unit 10B-3 is electrically connected to a data line pair $DL_2$ and $\overline{DL_2}$ through a transfer circuit 40-2. These data line pairs $DL_1$ and $\overline{DL_1}$ and $DL_2$ and $\overline{DL_2}$ are electrically connected in common with an input/output circuit 50. Specific configurations and functions of these elements will be easily understood by reference to the aforementioned embodiments.

The semiconductor memory device according to the present embodiment can bring about the following advantageous effects as well as the same advantageous effect as that obtained by the semiconductor memory device according to the first embodiment.

In the semiconductor memory device shown in FIG. 1, the ROM data is defined by electrically connecting each of the memory cells to the conductive line. There is therefore a possibility of an increase in size of the pattern of each memory cell and an increase in pitch (width) between the pair of bit lines according to the conditions of a process. If the memory cells for the DROM unit and those for the DRAM unit are formed within the same subarray to cope with such a case, it is then necessary to dimensionally increase each of the memory cells for the DRAM unit so as to correspond to the size of each memory cell for the DROM unit. If this type of semiconductor memory device is laid out like the semiconductor memory device according to the present embodiment in such a case, then the area of a chip can be effectively used.

If the layout of the semiconductor memory device according to the present embodiment is applied to each of the semiconductor memory devices according to the first through fifth embodiments, then the aforementioned advantageous effect can be brought about.

Figure 16:
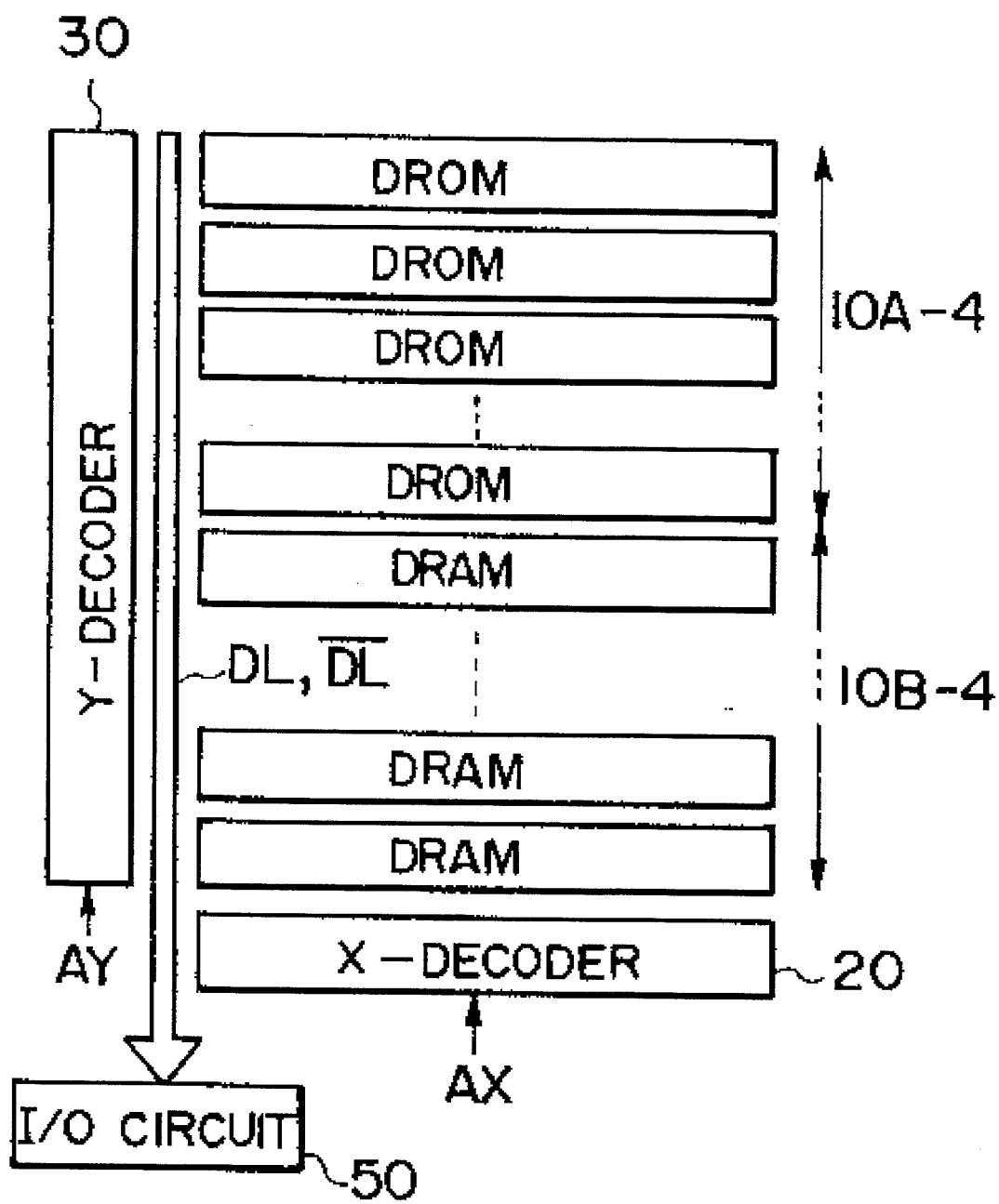
FIG. 16 is a view depicting a schematic layout of a semiconductor memory device according to an eighth embodiment of the present invention.

An eighth embodiment of the present invention will be next described with reference to FIG. 16. FIG. 16 is a view illustrating a schematic layout of a semiconductor memory device according to the eighth embodiment. In this case, the same elements of structure as those shown above are identified by like reference numerals and their description will therefore be omitted. Specific configurations and functions of these elements will be easily understood by reference to the aforementioned embodiments.

A memory cell array employed in the semiconductor memory device according to the present embodiment is divided into a DROM unit 10A-4 and a DRAM unit 10B-4 so that they correspond to a high-order section and a low-order section of a Y decoder 30. In the present embodiment, the memory cell array is divided into the DROM unit 10A-4 and the DRAM unit 10B-4 so that they correspond to unit Y decoders $30_1$ through $30_{i-1}$ and $30_i$ through $30n$, for example. Other configurations and functions can be understood by reference to the above description.

The semiconductor memory device according to the present embodiment can bring about the following advantageous effects as well as the same advantageous effect as that obtained by the semiconductor memory device according to the first embodiment.

In the semiconductor memory device shown in FIG. 1, the ROM data is defined by electrically connecting each of the memory cells to the conductive line. Therefore, there is a possibility of an increase in size of the pattern of each memory cell and an increase in pitch (width) between the pair of word lines according to the conditions of a process. If the memory cells for the DROM unit and those for the DRAM unit are formed within the same subarray to cope with such a case, it is then necessary to dimensionally increase each of the memory cells for the DRAM unit so as to correspond to the size of each memory cell for the DROM unit. If the semiconductor memory device shown in FIG. 1 is laid out like the semiconductor memory device according to the present embodiment in such a case, then the area of a chip can be effectively used.

When a semiconductor memory device normally performs a serial access operation, a sequence of X addresses AX are often incremented so as to effect the serial access operation. In such a case, the sequence of X addresses AX are often defined as low-order addresses corresponding to a series of external addresses generated by a CPU or the like and a sequence of Y addresses are often defined as high-order addresses. Therefore, the layout of the semiconductor memory device according to the present embodiment can be applied to such a semiconductor memory device. For example, two chips of a DRAM and a mask ROM are employed to realize a serial access operation for voice or speech synthesis. However, if the structure of the present embodiment is used, then the serial access operation for the speech synthesis can be realized on a single chip.

Further, the boundary between the DROM unit and the DRAM unit in the memory cell array of the semiconductor memory device according to the present embodiment can be freely set. That is, the proportion of the DROM unit in the memory cell array can be easily set.

If the layout of the semiconductor memory device according to the present embodiment is applied to each of the semiconductor memory devices according to the first through fifth embodiments, then the aforementioned advantageous effect can be obtained.

Figure 17:
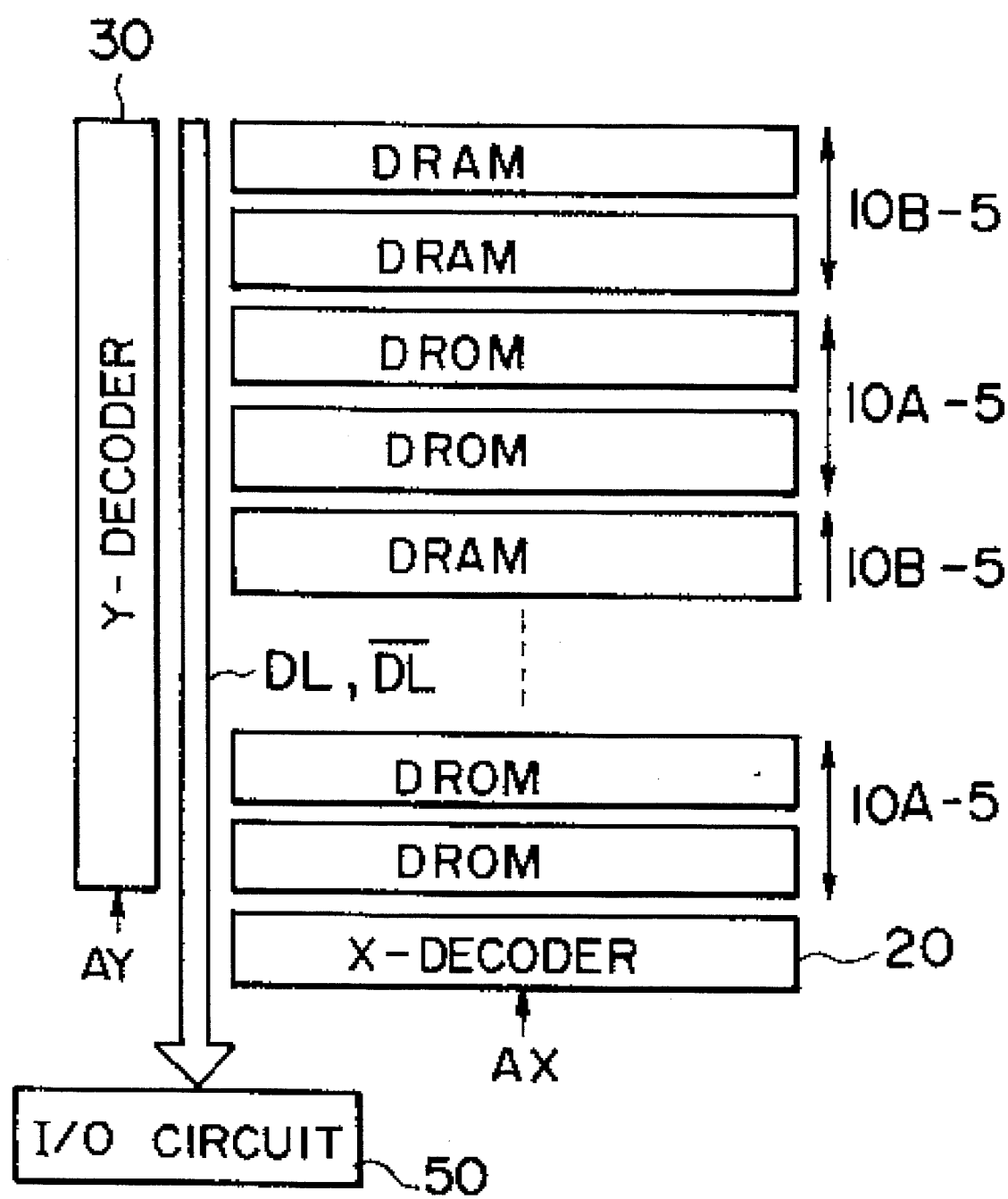
FIG. 17 is a view showing a schematic layout of a semiconductor memory device according to a ninth embodiment of the present invention.

A ninth embodiment of the present invention will next be described with reference to FIG. 17. FIG. 17 is a view illustrating a schematic layout of a semiconductor memory device according to the ninth embodiment. In this case, the same elements of structure as those shown above are identified by like reference numerals and their description will therefore be omitted. Specific configurations and functions of these elements will be easily understood by reference to the above embodiments.

In the semiconductor memory device according to the present embodiment, a memory cell array is divided into a plurality of subarray groups, i.e., a plurality of subarray groups 10A-5 for a DROM unit and a plurality of subarray groups 10B-5 for a DRAM unit, which are alternately provided in the memory cell army. Other configurations and functions can be understood by reference to the above description.

The semiconductor memory device according to the present embodiment has an advantageous effect similar to that obtained by the semiconductor memory device according to the eighth embodiment. Further, since the subarray groups 10A-5 for the DROM unit and the subarray groups 10B-5 for the DRAM unit are alternately disposed in the semiconductor memory device according to the present embodiment, a ROM and a RAM can be realized in combination on a single chip.

If the layout of the semiconductor memory device according to the present embodiment is applied to each of the semiconductor memory devices according to the first through fifth embodiments, then the aforementioned advantageous effect can be obtained.

Figure 18:
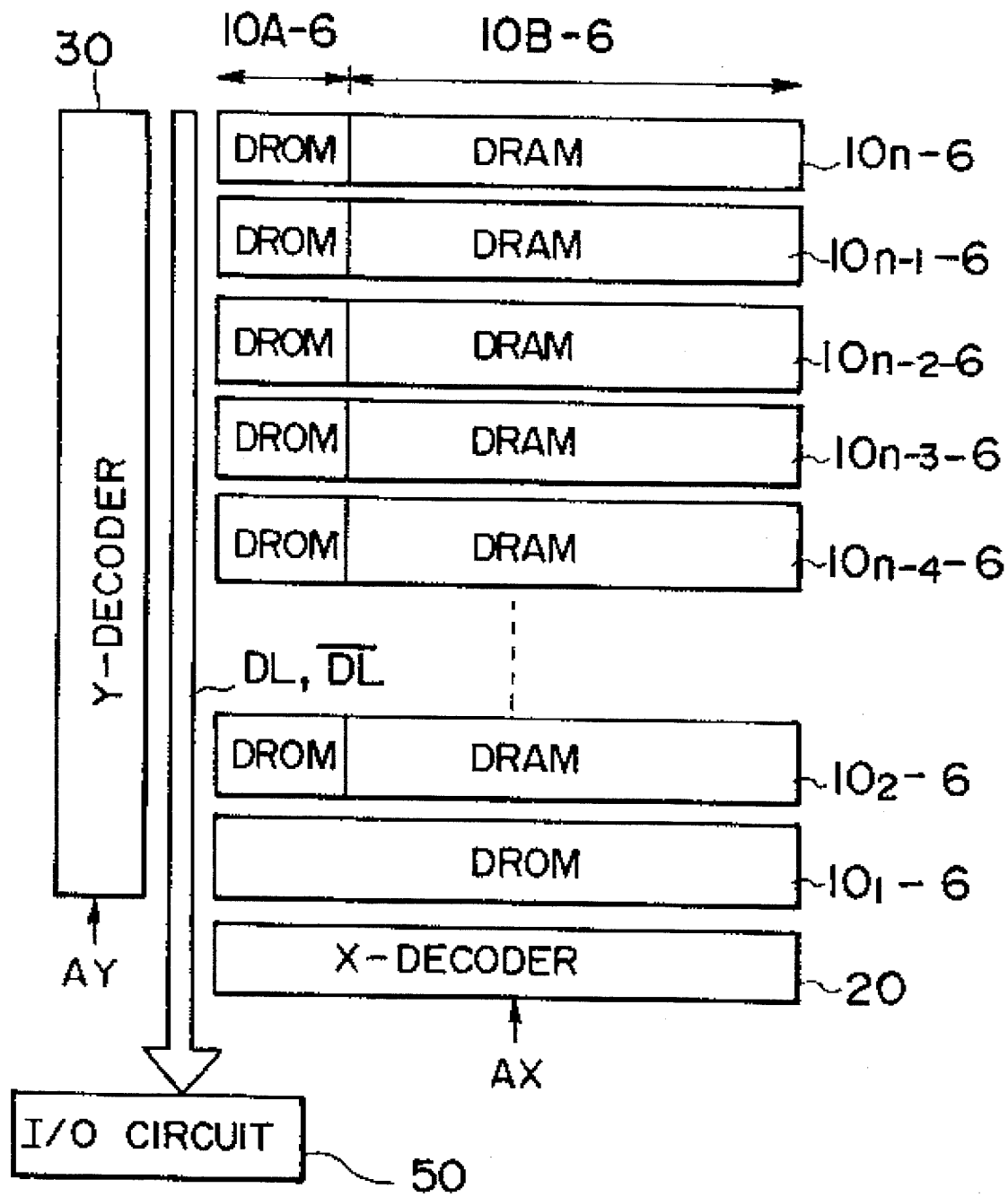
FIG. 18 is a view illustrating a schematic layout of a semiconductor memory device according to a tenth embodiment of the present invention.

A tenth embodiment of the present invention will now be described with reference to FIG. 18. FIG. 18 is a view illustrating a schematic layout of a semiconductor memory device according to the tenth embodiment. In this case, the same elements of structure as those shown above are identified by the same reference numerals and their description will therefore be omitted. Specific configurations and functions of these elements will be easily understood by reference to the above embodiments.

The semiconductor memory device according to the present embodiment is made up of a combination of the first embodiment and the eighth embodiment. That is, the semiconductor memory device according to the present embodiment has a DROM unit 10A-6 provided within a part of a set of subarrays $10_{2-6}$ through $10_{n-6}$ of a memory cell array, a DRAM unit 10B-6 provided within the remaining part thereof and a subarray $10_{1-6}$ which forms a DROM unit. The DROM unit 10A-6 of the set of subarrays $10_{2-6}$ through $10_{n-6}$ is selected based on a low-order address of a sequence of X addresses AX. The DROM unit for the subarray $10_{1-6}$ is selected based on a low-order address of a sequence of Y addresses AY.

The semiconductor memory device according to the present embodiment has an advantageous effect similar to that obtained by each of the first and eighth embodiments. Further, when the memory cell array is divided into n blocks and employed in the form of the divided n blocks in an application of such a type that a sequence of Y addresses AY are incremented when a sequence of X addresses AX are incremented so as to generate the maximum X address, ROM data can be used as an indicator used for each block. Incidentally, the DROM unit extending in a word line direction can also be provided on the high-order side of the sequence of X addresses AX. Alternatively, the DROM unit on the low-order side of the sequence of Y addresses AY can also be provided on the high-order side of the sequence of Y addresses AY.

If the layout of the semiconductor memory device according to the present embodiment is applied to each of the semiconductor memory devices according to the first through fifth embodiments, then the aforementioned advantageous effect can be brought about.

Figure 19:
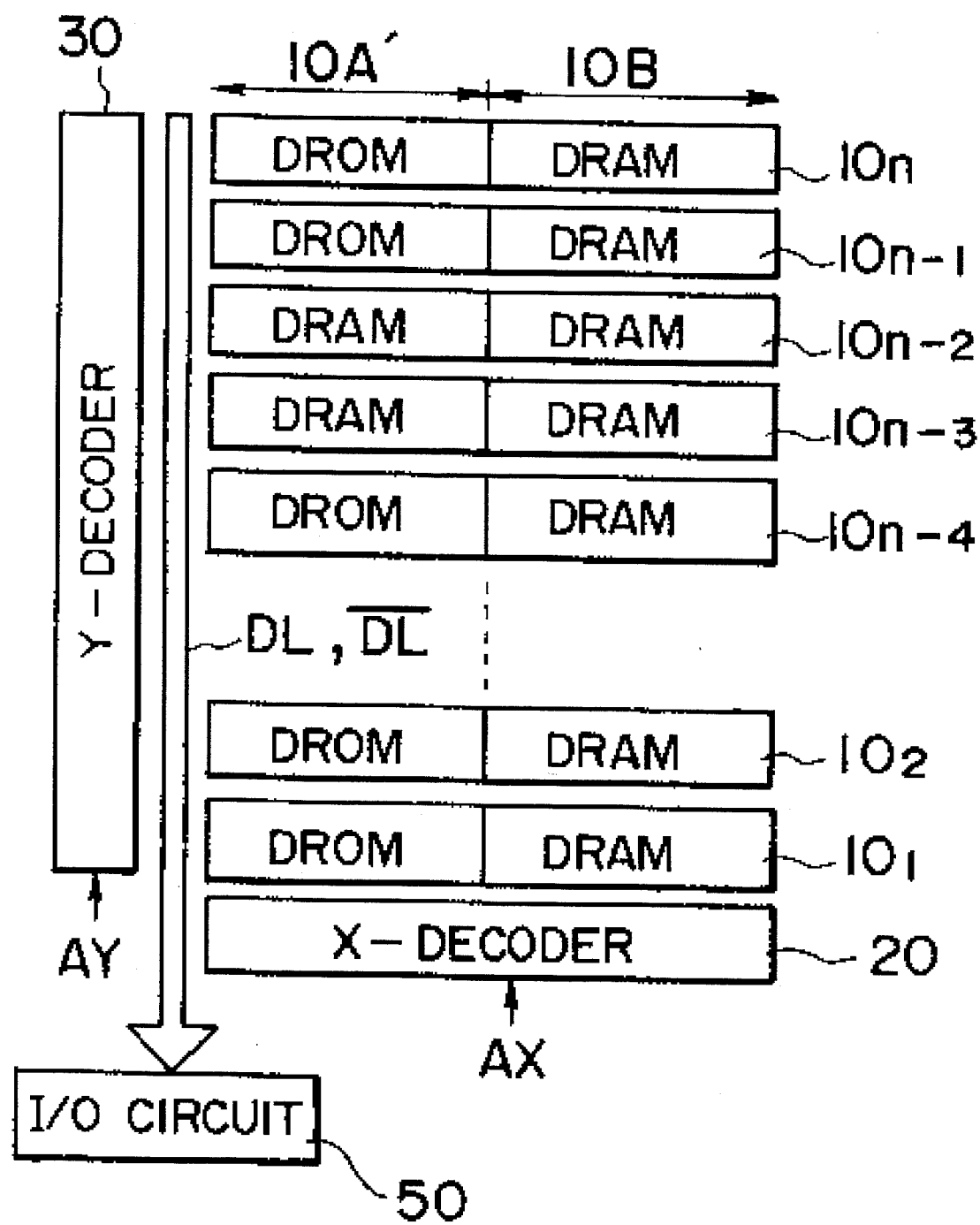
FIG. 19 is a view showing a schematic layout of a semiconductor memory device according to an eleventh embodiment of the present invention.

An eleventh embodiment of the present invention will next be described with reference to FIG. 19. FIG. 19 is a view illustrating a schematic layout of a semiconductor memory device according to the eleventh embodiment. In this case, the same elements of structure as those shown above are identified by like reference numerals and their description will therefore be omitted. Specific configurations and functions of these elements will be easily understood by reference to the above-described embodiments.

In the semiconductor memory device according to the present embodiment, the DROM units of predetermined subarrays in the memory cell array of the semiconductor memory device according to the first embodiment shown in FIG. 5 are replaced by DRAM units to form a DROM unit 10A'. That is, DROM units in subarrays $10_{n-2}$ and $10_{n-3}$ are replaced by DRAM units and the subarrays $10_{n-2}$ and $10_{n-3}$ are respectively comprised of the DRAM units.

The semiconductor memory device according to the present embodiment has an advantageous effect similar to that obtained by the aforementioned first embodiment. Further, when an area occupied by all the memory cells for a DROM unit is larger than that occupied by all the memory cells for a DRAM unit, the pitch or the like of each of wires or conductors in each DROM unit can be adjusted by arranging memory cells for a DRAM in a desired subarray. Therefore, the entire memory cell array can be formed based on a design standard for the DRAM unit.

If the layout of the semiconductor memory device according to the present embodiment is applied to each of the semiconductor memory devices according to the first through fifth embodiments, then the aforementioned advantageous effect can be brought about.

Figure 20:
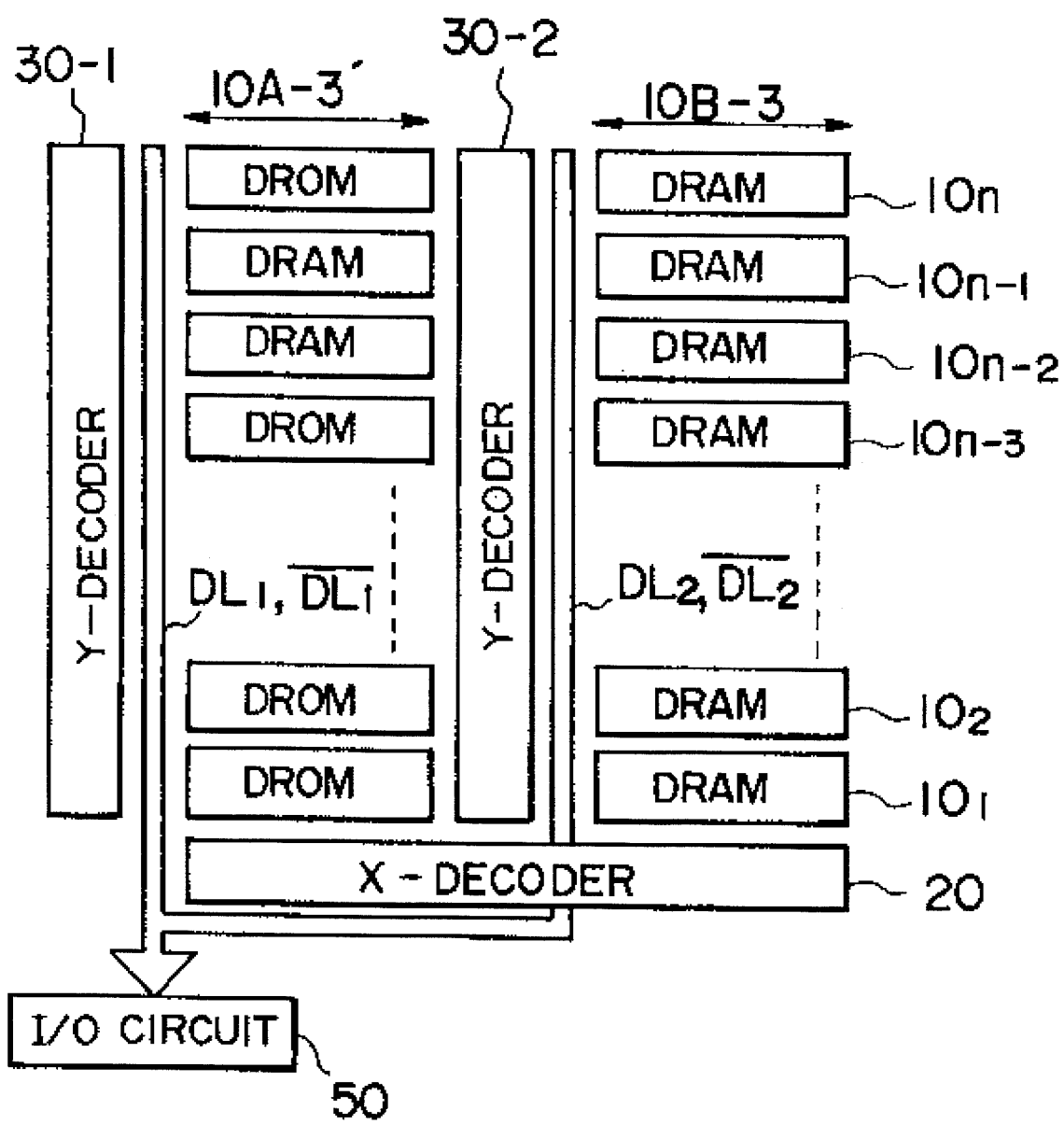
FIG. 20 is a view depicting a schematic layout of a semiconductor memory device according to a twelfth embodiment of the present invention.

A twelfth embodiment of the present invention will next be described with reference to FIG. 20. FIG. 20 is a view illustrating a schematic layout of a semiconductor memory device according to the twelfth embodiment. In this case, the same elements of structure as those described above are identified by the same reference numerals and their description will therefore be omitted. Specific configurations and functions of these elements will be easily understood by reference to the aforementioned embodiments.

In the semiconductor memory device according to the present embodiment, the DROM units of predetermined subarrays in the memory cell array of the semiconductor memory device according to the seventh embodiment shown in FIG. 15 are replaced by DRAM units to form a DROM unit 10A-3'. That is, DROM units in subarrays $10_{n-2}$ and $10_{n-1}$ are replaced by DRAM units and the subarrays $10_{n-2}$ and $10_{n-1}$ are respectively comprised of the DRAM units.

The semiconductor memory device according to the present embodiment has an advantageous effect similar to that obtained by the aforementioned seventh embodiment. Further, when an area occupied by all the memory cells for a DROM unit is larger than that occupied by all the memory cells for a DRAM unit, the pitch or the like of each of wires or conductors in each DROM unit can be adjusted by arranging memory cells for a DRAM unit in a desired subarray. Therefore, the entire memory cell array can be formed based on a design standard for the DRAM unit.

If the layout of the semiconductor memory device according to the present embodiment is applied to each of the semiconductor memory devices according to the first through fifth embodiments, then the aforementioned advantageous effect can be brought about.

Figure 21:
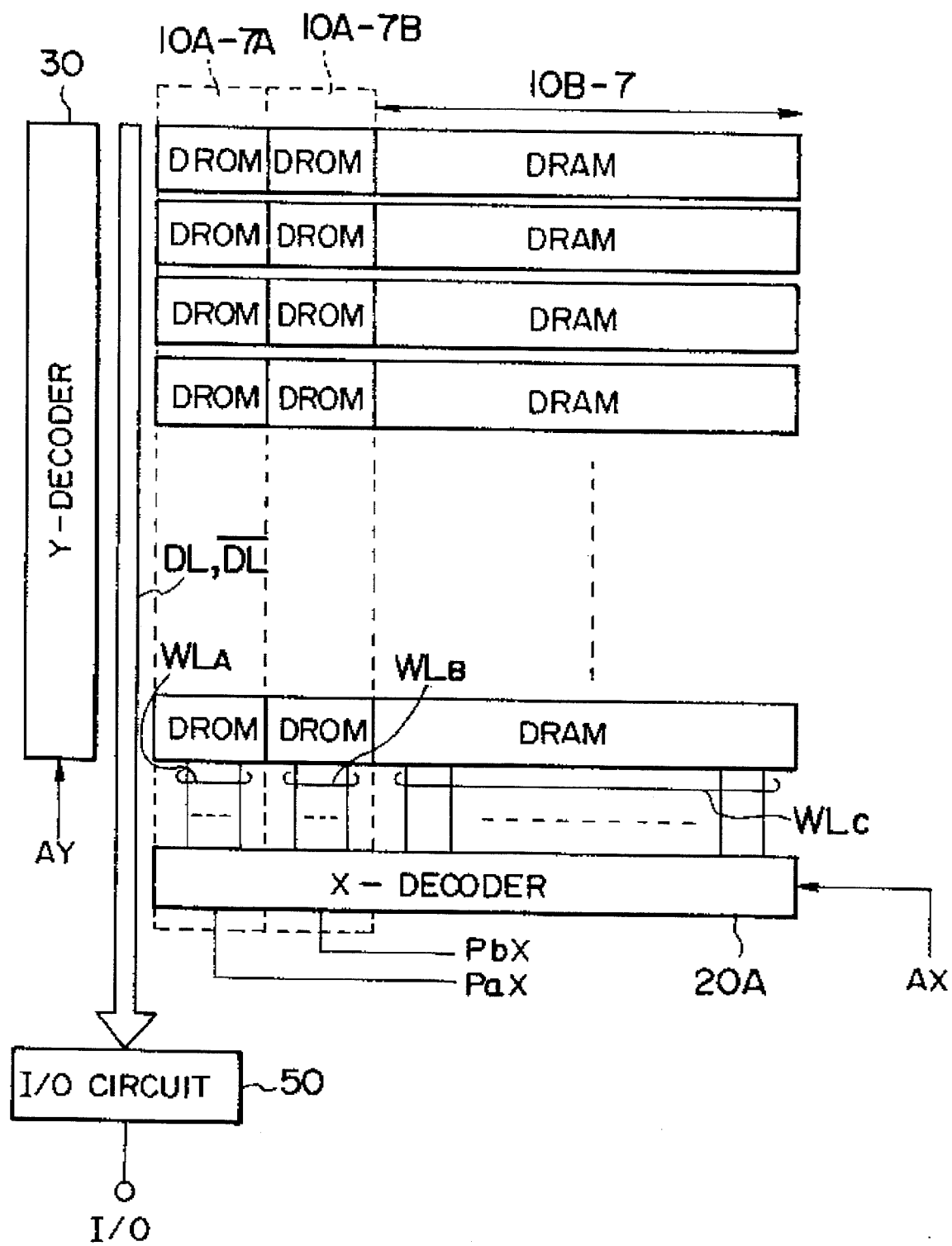
FIG. 21 is a view illustrating a schematic layout of a semiconductor memory device according to a thirteenth embodiment of the present invention.

A thirteenth embodiment of the present invention will next be described with reference to FIG. 21. FIG. 21 is a view illustrating a schematic layout of a semiconductor memory device according to the thirteenth embodiment. In this case, the same elements of structure as those described above are identified by the same reference numerals and their description will therefore be omitted. Specific configurations and functions of these elements will be easily understood by reference to the aforementioned embodiments.

The semiconductor memory device according to the present embodiment is constructed in a manner similar to the semiconductor memory device according to the first embodiment such that DROM units and DRAM units are formed within a memory cell army. Further, the DROM unit employed in the present embodiment is divided into a DROM unit 10A-7A and a DROM unit 10A-7B. The DROM unit 10A-7A and the DROM unit 10A-7B are respectively selectively activated in response to selection signals PaX and PbX. That is, circuit portions or sections for selecting the DROM units 10A-7A and 10A-7B respectively, of an X decoder 20A for selecting a word line group $WL_A$ electrically connected to the DROM unit 10A-7 A, a word line group $WL_B$ electrically connected to the DROM unit 10A-7B and a word line group $WL_C$ electrically connected to a DRAM unit 10B-7 based on a sequence of X addresses AX, are selectively activated in response to the selection signals PaX and PbX.

A specific circuit configuration of the X decoder 20A will now be described with reference to FIG. 22. The X decoder 20A comprises NAND gates 21-1, 21-2, . . . , 22-1, 22-2, . . . , 23-1, 232, 2, . . . , activated in response to a word-line drive enable signal WD so as to decode X addresses A0X, $\overline{\text{A0X}}$ through AmX and $\overline{\text{AmX}}$ and inverters 24-1, 24-2, . . . , 25-1, 25-2, . . . , 26-1, 26-2 for inverting outputs produced from the NAND gates. When the selection signal PaX is of a High Level, for example, the NAND gates 21-1, 21-2 are activated and decode the sequence of X addresses AX. Next, the outputs produced from the NAND gates 21-1, 21-2, ... are inverted by the inverters 24-1 and 24-2. Thus, a single word line is selected from the word line group $WL_A$ ($WL_{A1}$, $WL_{A2}$, ... ) electrically connected to the DROM unit 10A-7A.

Similarly, when the selection signal PbX is of a High Level, for example, the NAND gates 22-1, 22-2, ... are activated and decode the sequence of X addresses AX. Next, the outputs produced from the NAND gates 22-1, 22-2, ... are inverted by the inverters 25-1, 25-2. Thus, a single word line is selected from the word line group $WL_B$ ($WL_{B1}$, $WL_{B2}$, ... ) electrically connected to the DROM unit 10A-7B.

The NAND gates 23-1, 23-2, ... are activated in response to the word-line drive enable signal WD and decode the sequence of X addresses AX. Next, the outputs produced from the NAND gates 23-1, 23-2, ... are inverted by the inverters 26-1, 26-2. A single word line is selected from the word line group $WL_C$ ($WL_{C1}$, $WL_{C2}$, ... ) electrically connected to the DRAM unit 10B-7 in this way.

The operation of the semiconductor memory device of the present invention will next be described in brief. Its detailed operation can be easily understood by reference to that of the first embodiment described above.

When the sequence of X addresses AX are first input to the X decoder 20A, the X decoder 20A decodes high-order addresses of the sequence of X addresses AX using the NAND gates 23-1 and 23-2. A single word line of the word line group $WL_C$ is brought to a High Level based on the result of decoding. Memory cells electrically connected to the selected word line are constructed in a manner similar to those employed in the first embodiment described above.

Further, the semiconductor memory device according to the present embodiment is constructed such that either one of the DROM unit 10A-7A and the DROM unit 10A-7B can be selected in response to either one of the selection signals PaX and PbX. When the selection signal PaX is brought to the High Level, the NAND gates 21-1, 21-2, ... are activated to select a single word line from the word line group $WL_A$. When the selection signal PbX is brought to the High Level, the NAND gates 22-1, 22-2, ... are activated to select one of the word line group $WL_B$. A description will be made, as an example, a case where the sequence of X addresses AX are incremented, for example. When the selection signal PaX is of the High Level, the NAND gates 21-1, 21-2, ..., 23-1, 23-2, ... respectively select the word lines $WL_{A1}$, $WL_{A2}$, ..., $WL_{B1}$, $WL_{B2}$, ..., $WL_{C1}$, $WL_{C2}$, ... in turn. On the other hand, when the selection signal PbX is of the High Level, the NAND gates 22-1, 22-2, ... 23-1, 23-2, ... respectively select the word lines $WL_{B1}$, $WL_{B2}$, ..., $WL_{C1}$, $WL_{C2}$, ... in order.

The semiconductor memory device according to the present embodiment can bring about the same advantageous effect as that obtained by the semiconductor memory device according to the first embodiment. Further, since the semiconductor memory device according to the present embodiment can selectively use either one of the two DROM units, fixed data stored in memory cells for a desired ROM can be used in the same system without changing the setting of the addresses.

How to use the selection signals PaX and PbX is considered as follows. That is, (i) selection signal terminals are attached to each memory element and the selection signals PaX and PbX are supplied to the selection signal terminals from the outside when in operation, (ii) selection signal terminals are attached to each memory element and a user fixes or sets the potential at either one of the selection signal terminals in advance to thereby decide a DROM unit to be used, and (iii) the level of each of the selection signals PaX and PbX is fixed by a laser or the like upon wafer probing to thereby decide a DROM unit to be used.

If the layout of the semiconductor memory device according to the present embodiment is applied to each of the semiconductor memory devices according to the first through fifth embodiments, then the aforementioned advantageous effect can be obtained.

Figure 23:
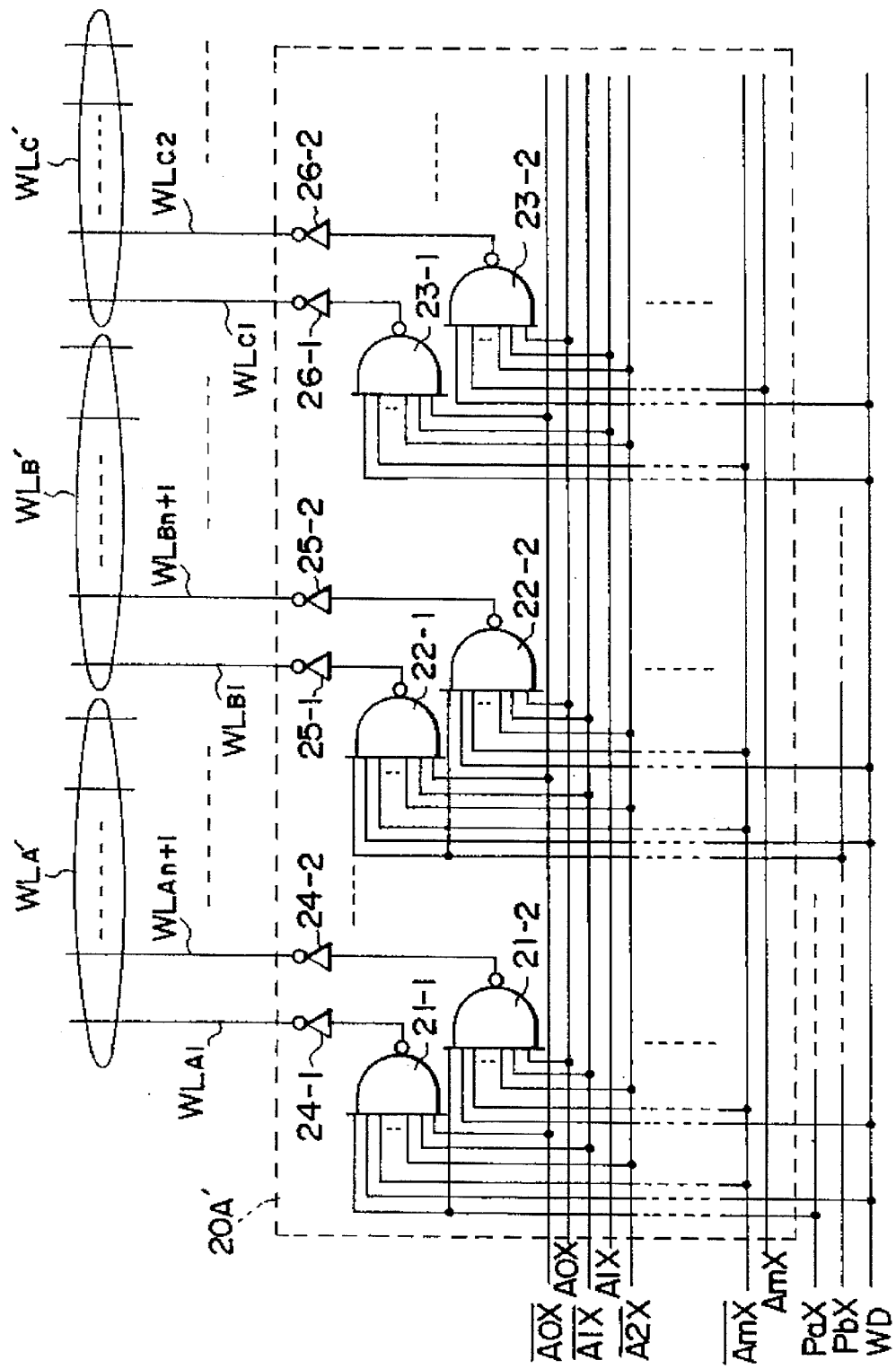
FIG. 23 is a partial circuit diagram illustrating a circuit configuration of an X decoder employed in a semiconductor memory device according to a fourteenth embodiment of the present invention.

A fourteenth embodiment of the present invention will next be described with reference to FIG. 23. FIG. 23 is a view illustrating a fragmentary circuit configuration of an X decoder employed in a semiconductor memory device according to the fourteenth embodiment. In this case, the same elements of structure as those shown above are identified by like reference numerals and their description will therefore be omitted. Specific configurations and functions of these elements will be easily understood by reference to the thirteenth embodiment in particular.

In the semiconductor memory device according to the present embodiment, a configurational circuit of an X decoder 20A' is provided as an alternative to that of the X decoder 20A in such a manner that word lines electrically connected to the memory cells for DROM units 10A-7A and 10A-7B are arranged in ascending order (or in descending order starting from an address AmX) starting from an address AOX of a sequence of X addresses AX every memory cells on the positive and negative logic sides. That is, the word lines are arranged in order of $W_{LA1}$, $WL_{An+1}$, $WL_{A2}$, $WL_{An+2}$, ..., $WL_{An}$, $WL_{A2n}$ in a word line group $WL_A'$, whereas the word lines are arranged in order of $WL_{B1}$, $WL_{Bn+1}$, ..., $WL_{Bn}$, $WL_{B2n}$ in a word line group $WL_B'$. The arrangement of the word line groups for the DROM units can be set as needed. The operation of the semiconductor memory device according to the present embodiment is identical to that of the semiconductor memory device according to the thirteenth embodiment.

If the structure of the semiconductor memory device according to the present embodiment is used, then the evaluation of the memory cell array can be easily effected upon its evaluation.

If the layout of the semiconductor memory device according to the present embodiment is applied to each of the semiconductor memory devices according to the first through fifth embodiments, then the aforementioned advantageous effect can be obtained.

Figure 24:
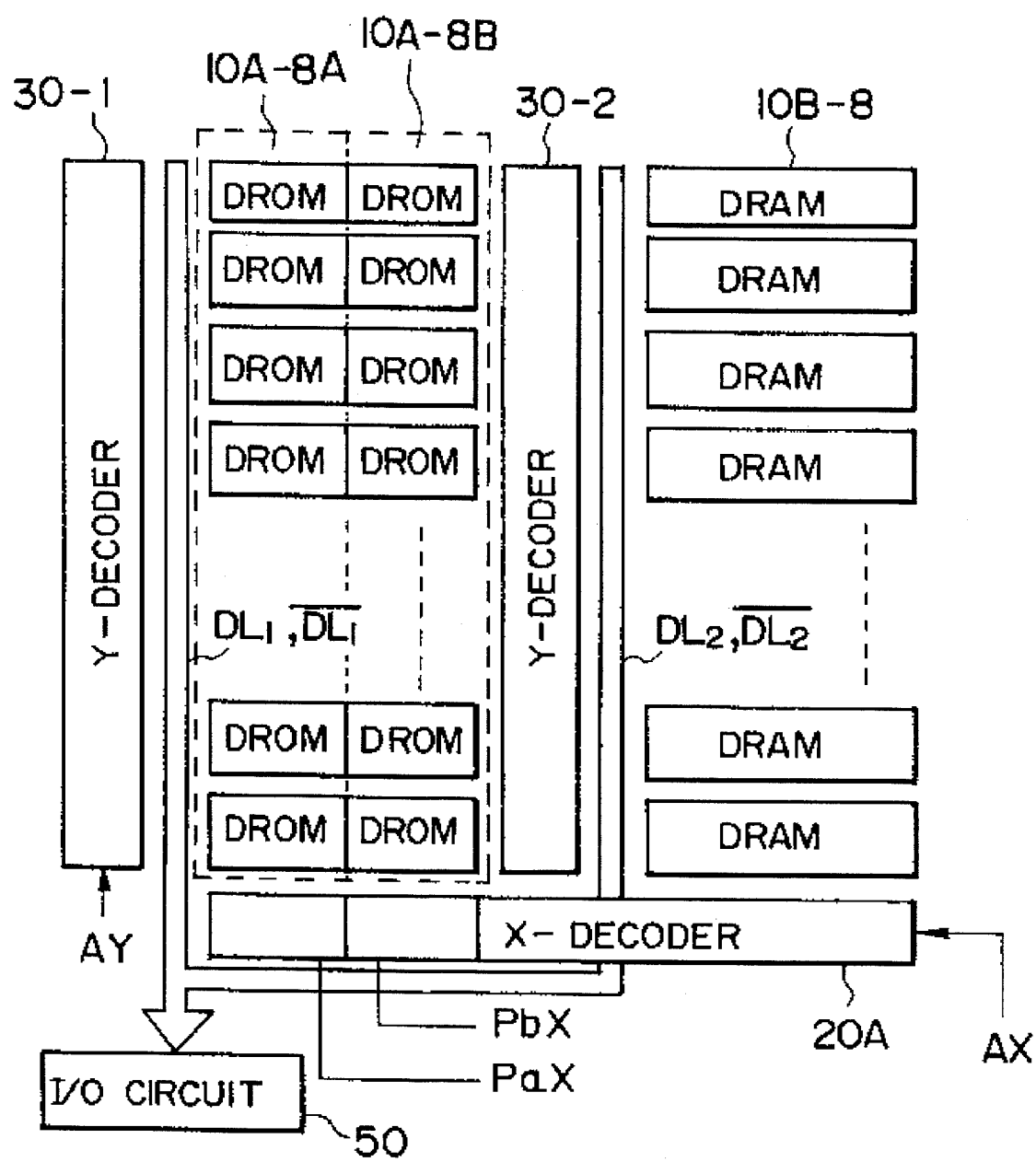
FIG. 24 is a view showing a schematic layout of a semiconductor memory device according to a fifteenth embodiment of the present invention.

A fifteenth embodiment of the present invention will next be described with reference to FIG. 24. FIG. 24 is a view illustrating a schematic layout of a semiconductor memory device according to the fifteenth embodiment. In this case, the same elements of structure as those shown above are identified by like reference numerals and their description will therefore be omitted. Specific configurations and functions of these elements will be easily understood by reference to the aforementioned embodiments, particularly the seventh embodiment shown in FIG. 15.

In the semiconductor memory device according to the present embodiment, the DROM unit 10A-3 shown in FIG. 15 is divided into a DROM unit 10A-8A and a DROM unit 10A-8B as described in the thirteenth embodiment shown in FIG. 21. The DROM unit 10A-8A and the DROM unit 10A-8B are respectively selectively operated in response to selection signals PaX and PbX. The semiconductor memory device according to the present embodiment is constructed in such a manner that either one of the DROM unit 10A-8A and the DROM unit 10A-8B can be selected in response to either the selection signal PaX or PbX. In this case, the configuration of an X decoder 20A is identical to that shown in FIG. 21. Further, the operation of the semiconductor memory device according to the present embodiment can be easily understood by reference to the description of the operation of the semiconductor memory device according to the thirteenth embodiment.

The semiconductor memory device according to the present embodiment has an advantageous effect similar to that obtained by the semiconductor memory device according to the thirteenth embodiment.

If the layout of the semiconductor memory device according to the present embodiment is applied to each of the semiconductor memory device according to the first through fifth embodiments, the aforementioned advantageous effect can be obtained.

Figure 25:
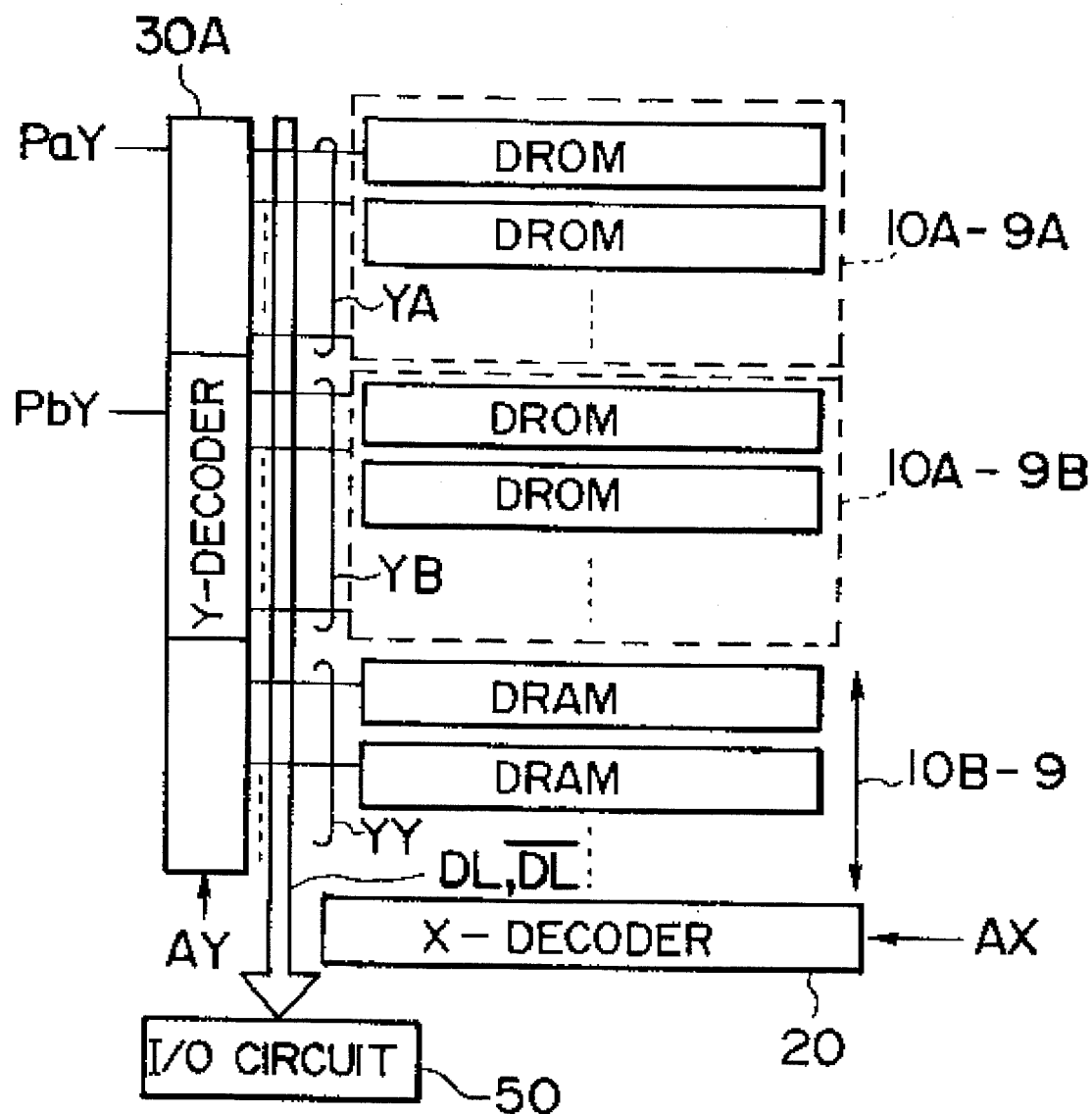
FIG. 25 is a view illustrating a schematic layout of a semiconductor memory device according to a sixteenth embodiment of the present invention.

A sixteenth embodiment of the present invention will next be described with reference to FIG. 25. FIG. 25 is a view illustrating a schematic layout of a semiconductor memory device according to the sixteenth embodiment. In this case, the same elements of structure as those shown above are identified by like reference numerals and their description will therefore be omitted. Specific configurations and functions of these elements will be easily understood by reference to the embodiments referred to above, particularly, the eighth embodiment shown in FIG. 16 and the thirteenth embodiment shown in FIG. 21.

A memory cell array employed in the semiconductor memory device according to the present embodiment is divided into a DROM units 10A-9A and 10A-9B and a DRAM unit 10B-9 along a column direction. Either the DROM unit 10A-9A or the DROM unit 10A-9B is selected by a Y decoder 30A in response to either a selection signal PaY or a selection signal PbY. The Y decoder 30A decodes a series or sequence of Y addresses AY and has a circuit portion or section for selecting a desired bit line pair from a group of bit line pairs arranged in the DROM unit 10A-9A in response to a Y decoder output signal group YA, a circuit section for selecting a desired bit line pair from a group of bit line pairs arranged in the DROM unit 10A-9B in response to a Y decoder output signal group YB and a circuit section for selecting a desired bit line pair from a group of bit line pairs arranged in the DRAM unit 10B-9 in response to a Y decoder output signal group YY. The Y decoder 30A selects either the DROM unit 10A-9A or the DROM unit 10A-9B in response to either the selection signal PaY or PbY.

Figure 26:
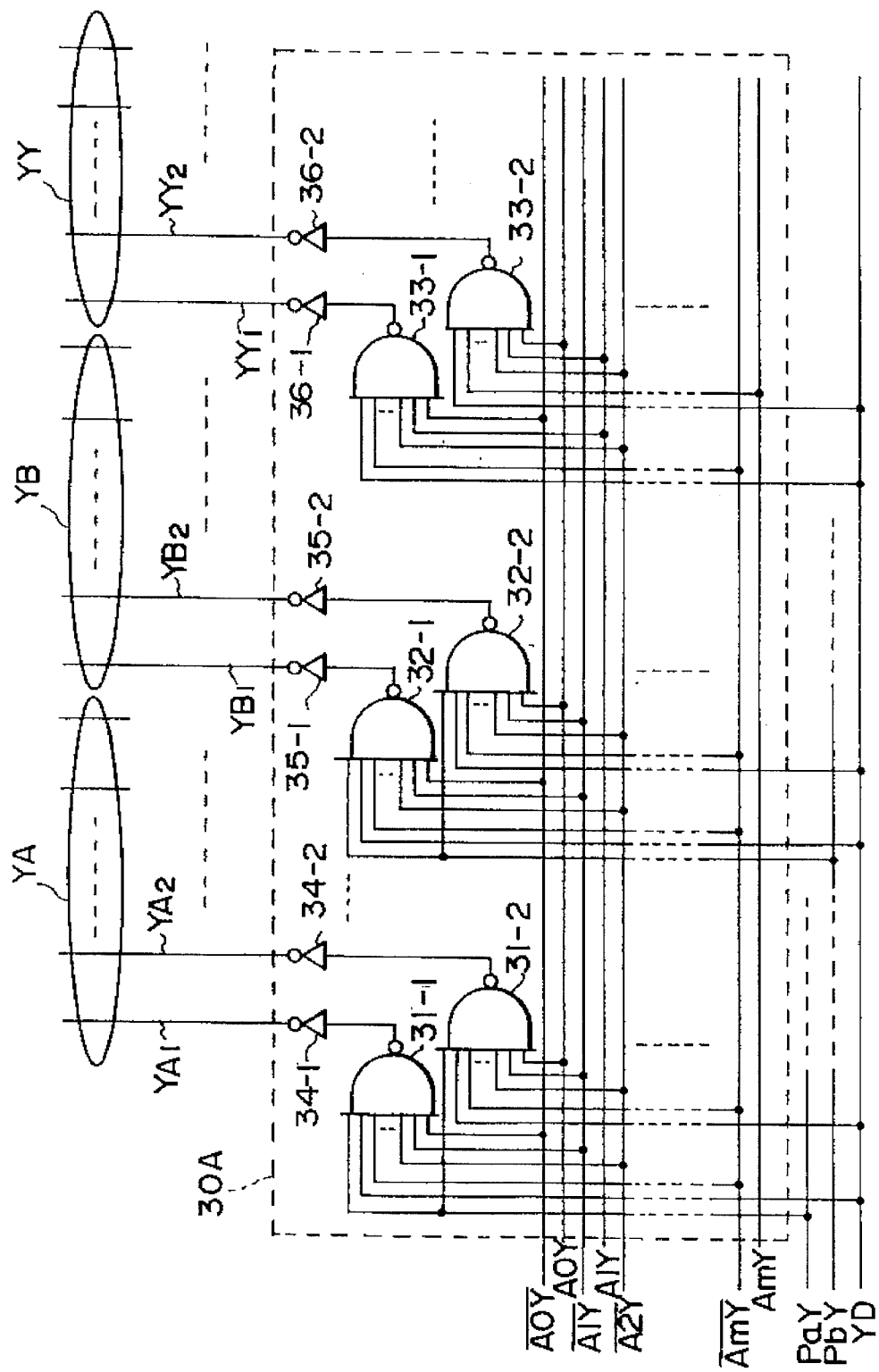
FIG. 26 is a partial circuit diagram showing a circuit configuration of a Y decoder employed in the semiconductor memory device depicted in FIG. 25.

A specific circuit configuration of the Y decoder 30A will now be described with reference to FIG. 26. The Y decoder 30A comprises NAND gates 31-1, 31-2, . . . , 32-1, 32-2, . . . , 33-1, 33-2, . . . , activated in response to a Y decoder output drive signal YD to thereby decode Y addresses A0Y, $\overline{A0Y}$ through AmY and $\overline{AmY}$, and inverters 34-1, 34-2, . . . , 35-1, 35-2, . . . , 36-1, 36-2, . . . , for inverting outputs produced from the NAND gates referred to above.

When the selection signal PaY is of a High Level, for example, the NAND gates 31-1, 31-2, . . . are activated so as to decode the sequence of Y addresses AY. Next, the outputs produced from the NAND gates 31-1, 31-2 are respectively inverted by the inverters 34-1 and 34-2. Thus, the Y decoder 30A outputs a column selection signal group YA to the DROM unit 10A-9A.

Similarly, when the selection signal PbY is of a High Level, for example, the NAND gates 32-1, 32-2, . . . are activated so as to decode the sequence of Y addresses AY. Next, the outputs produced from the NAND gates 32-1, 32-2, . . . are respectively inverted by the inverters 35-1 and 35-2. Thus, the Y decoder 30A outputs a column selection signal group YB to the DROM unit 10A-9B.

Similarly, the NAND gates 33-1, 33-2, . . . are activated in response to the Y decoder output drive signal YD so as to decode the sequence of Y addresses AY. Next, the outputs produced from the NAND gates 33-1, 33-2, . . . are respectively inverted by the inverters 36-1 and 36-2. Thus, the Y decoder 30A outputs a column selection signal group YY to the DRAM unit 10B-9.

As described above, the semiconductor memory device according to the present embodiment is constructed in such a manner that either the DROM unit 10A-9A or the DROM unit 10A-9b can be selected in response to either the selection signal PaY or PbY. When the selection signal PaY is brought to the High Level, the NAND gates 31-1, 31-2, . . . are activated so that the DROM unit 10A-9A is accessed. On the other hand, when the selection signal PbY is brought to the High Level, the NAND gates 32-1, 32-2, . . . are activated so that the DROM unit 10A-9B is accessed.

The semiconductor memory device according to the present embodiment can bring about the same advantageous effect as that obtained by each of the semiconductor memory devices according to the eighth and thirteenth embodiments. Further, since the semiconductor memory device according to the present embodiment can selectively use either one of the two DROM units, fixed data stored in memory cells for a desired ROM can be used in the same system without changing the setting of the addresses.

How to use the selection signals PaX and PbX is considered as follows. That is, (i) selection signal terminals are attached to each memory element and the selection signals PaX and PbX are supplied to the selection signal terminals from the outside when in operation, (ii) selection signal terminals are attached to each memory element and a user fixes or sets the potential at either one of the selection signal terminals in advance to thereby decide a DROM unit to be used, and (iii) the level of each of the selection signals PaX and PbX is fixed by a laser or the like upon wafer probing to thereby decide a DROM unit to be used.

If the layout of the semiconductor memory device according to the present embodiment is applied to each of the semiconductor memory devices according to the first through fifth embodiments, then the aforementioned advantageous effect can be obtained.

Figure 27:
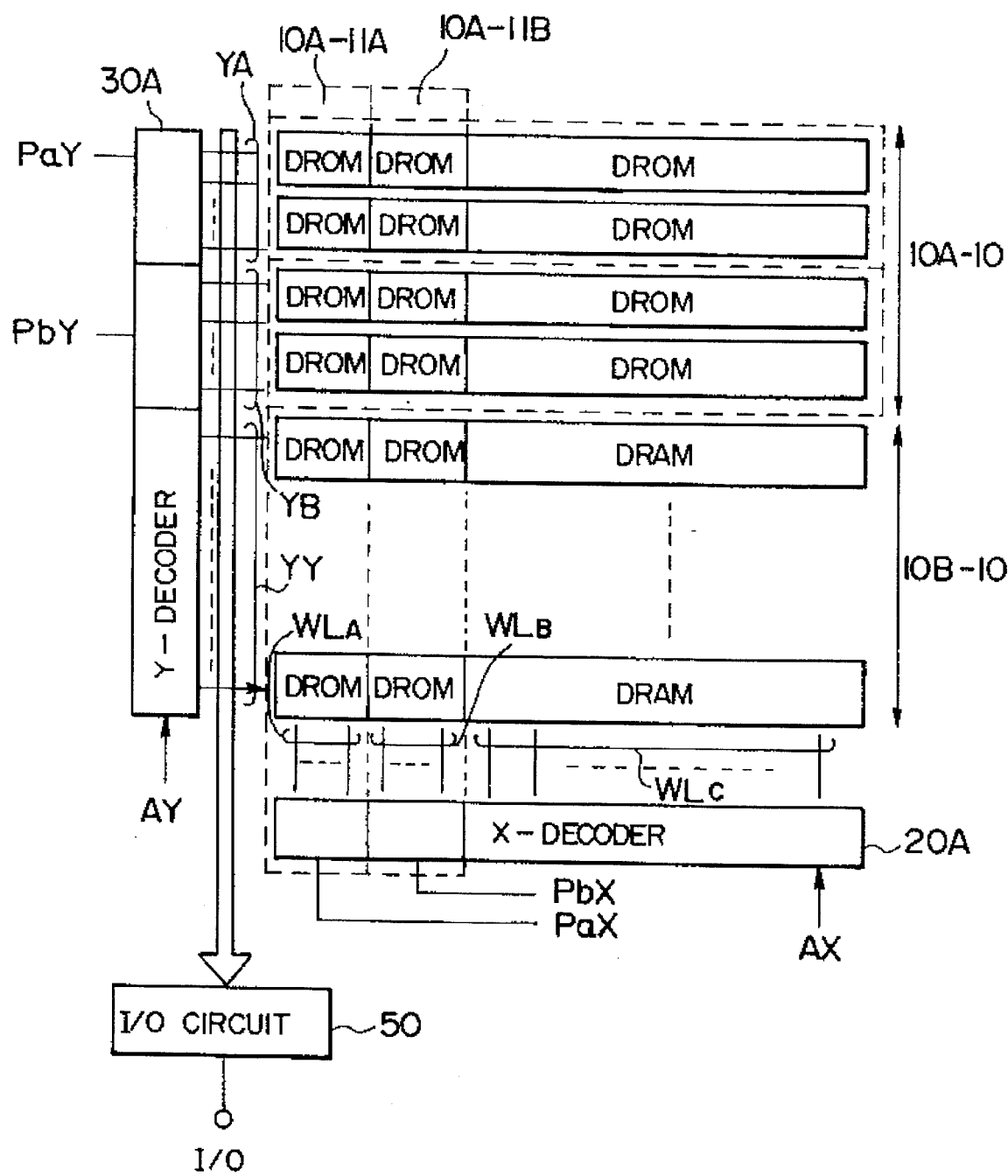
FIG. 27 is a view illustrating a schematic layout of a semiconductor memory device according to a seventeenth embodiment of the present invention.

A seventeenth embodiment of the present invention will next be described with reference to FIG. 27. FIG. 27 is a view illustrating a schematic layout of a semiconductor memory device according to the seventeenth embodiment. In this case, the same elements of structure as those shown above are identified by like reference numerals and their description will therefore be omitted. Specific configurations and functions of these elements will be easily understood by reference to the aforementioned embodiments, particularly, the tenth embodiment shown in FIG. 18, the thirteenth embodiment shown in FIG. 21 and the sixteenth embodiment shown in FIG. 25.

In the semiconductor memory device according to the present embodiment, a memory cell array is divided into a DROM unit 10A-10 and a DROM unit 10B-10 along a word line direction. Further, individual subarrays are divided into a DROM unit 10A-11A and a DROM unit 10A-11B along a column direction. The memory cell array is selectively operated in accordance with the X decoder shown in FIG. 22 and the Y decoder shown in FIG. 26. That is, memory cells can be selectively defined along the word line and column directions in response to selection signals PaX and PbX and selection signals PaY and PbY. The operation of the semiconductor memory device according to the present embodiment can be understood by reference to the description of the operations of the thirteenth and sixteenth embodiments.

According to the semiconductor memory device showing the present embodiment, a memory block in each DROM unit can be selected based on the selection signals PaX and PbX and PaY and PbY along X and Y directions. It is thus possible to provide various types of semiconductor memory devices depending on a user's demand.

If the layout of the semiconductor memory device according to the present embodiment is applied to each of the semiconductor memory devices according to the first through fifth embodiments, then the aforementioned advantageous effect can be obtained.

Figure 28:
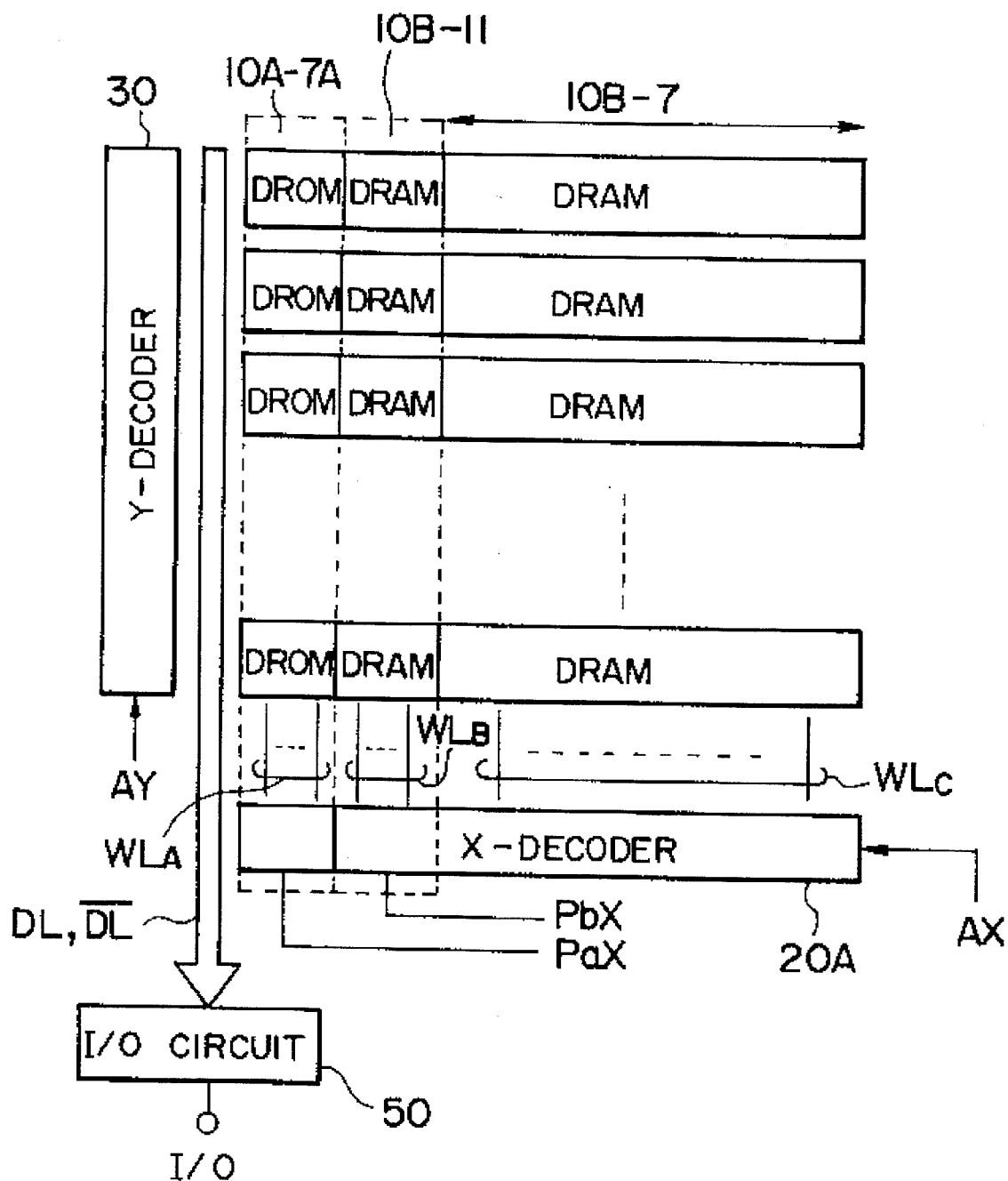
FIG. 28 is a view showing a schematic layout of a semiconductor memory device according to an eighteenth embodiment of the present invention.

An eighteenth embodiment of the present invention will next be described with reference to FIG. 28. FIG. 28 is a view illustrating a schematic layout of a semiconductor memory device according to the eighteenth embodiment. In this case, the same elements of structure as those shown above are identified by like reference numerals and their description will therefore be omitted. Specific configurations and functions of these elements will be easily understood by reference to the aforementioned embodiments, particularly, the thirteenth embodiment shown in FIG. 21.

In the semiconductor memory device according to the present embodiment, the DROM unit 10A-7B employed in the semiconductor memory device shown in FIG. 21 is replaced by a DRAM unit 10B-11. The operation of the semiconductor memory device can be easily understood by reference to that of the semiconductor memory device according to the thirteenth embodiment.

According to the semiconductor memory device showing the present embodiment, a DROM unit 10A-7A and a DRAM unit 10B-11 can be changed over from one to another based on selection signals PaX and PbX during operation. Further, either a semiconductor memory device of a type wherein a DRAM unit and a DROM unit are mixed together or a semiconductor memory device comprised of a DRAM unit alone can be selected by effecting trimming using a laser or the like under the state of a wafer.

Figure 22:
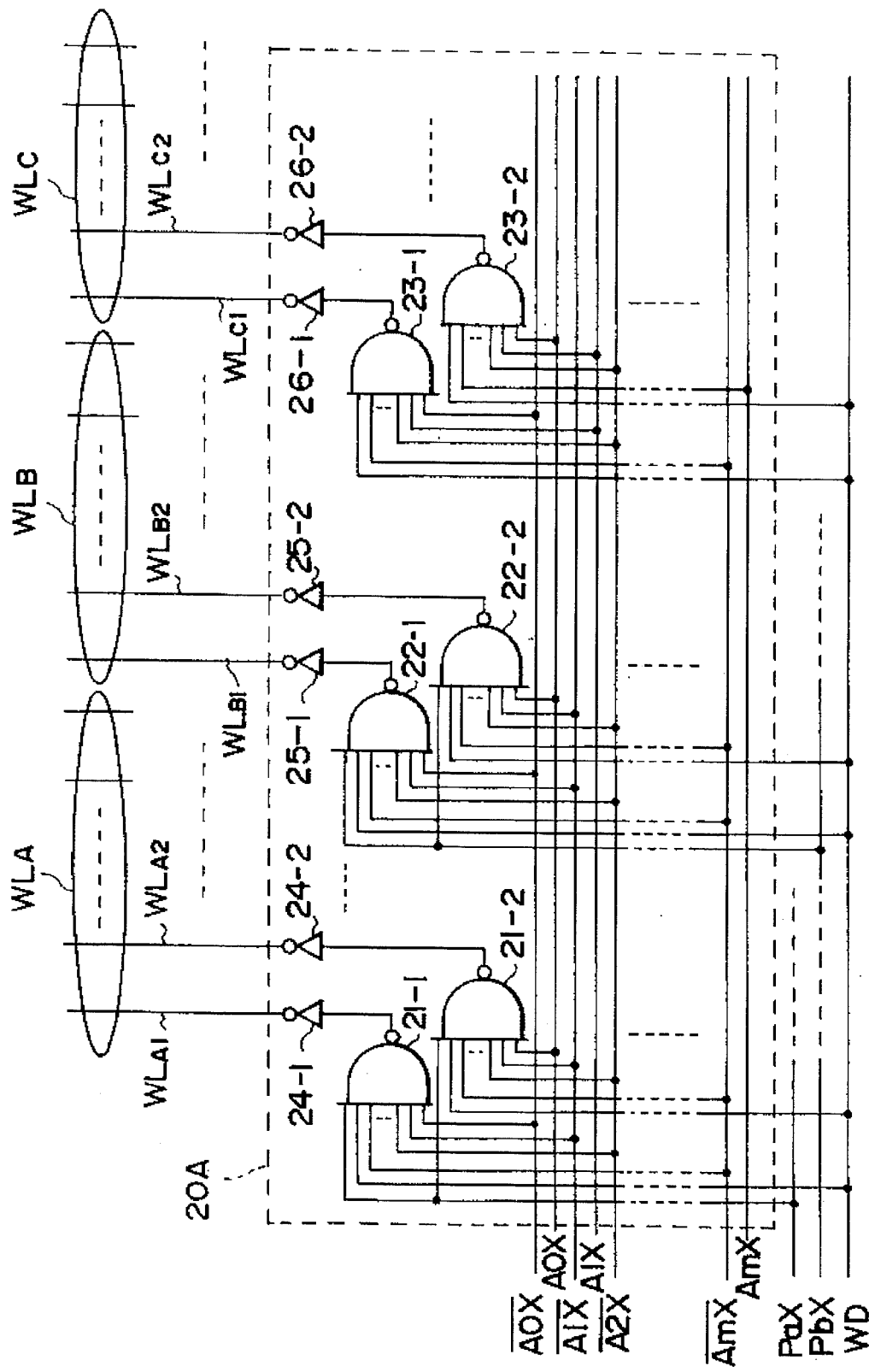
FIG. 22 is a partial circuit diagram showing a circuit configuration of an X decoder employed in the semiconductor memory device shown in FIG. 21.

Further, an X decoder 20A employed in the semiconductor memory device according to the present embodiment is identical in circuit configuration to that shown in FIG. 22. However, the X decoder 20A can also be replaced with the X decoder 20A' shown in FIG. 23. In doing so, the semiconductor memory device according to the present embodiment can bring about an advantageous effect similar to that described in the fourteenth embodiment.

If the layout of the semiconductor memory device according to the present embodiment is applied to each of the semiconductor memory devices according to the first through fifth embodiments, then the aforementioned advantageous effect can be obtained.

Figure 29:
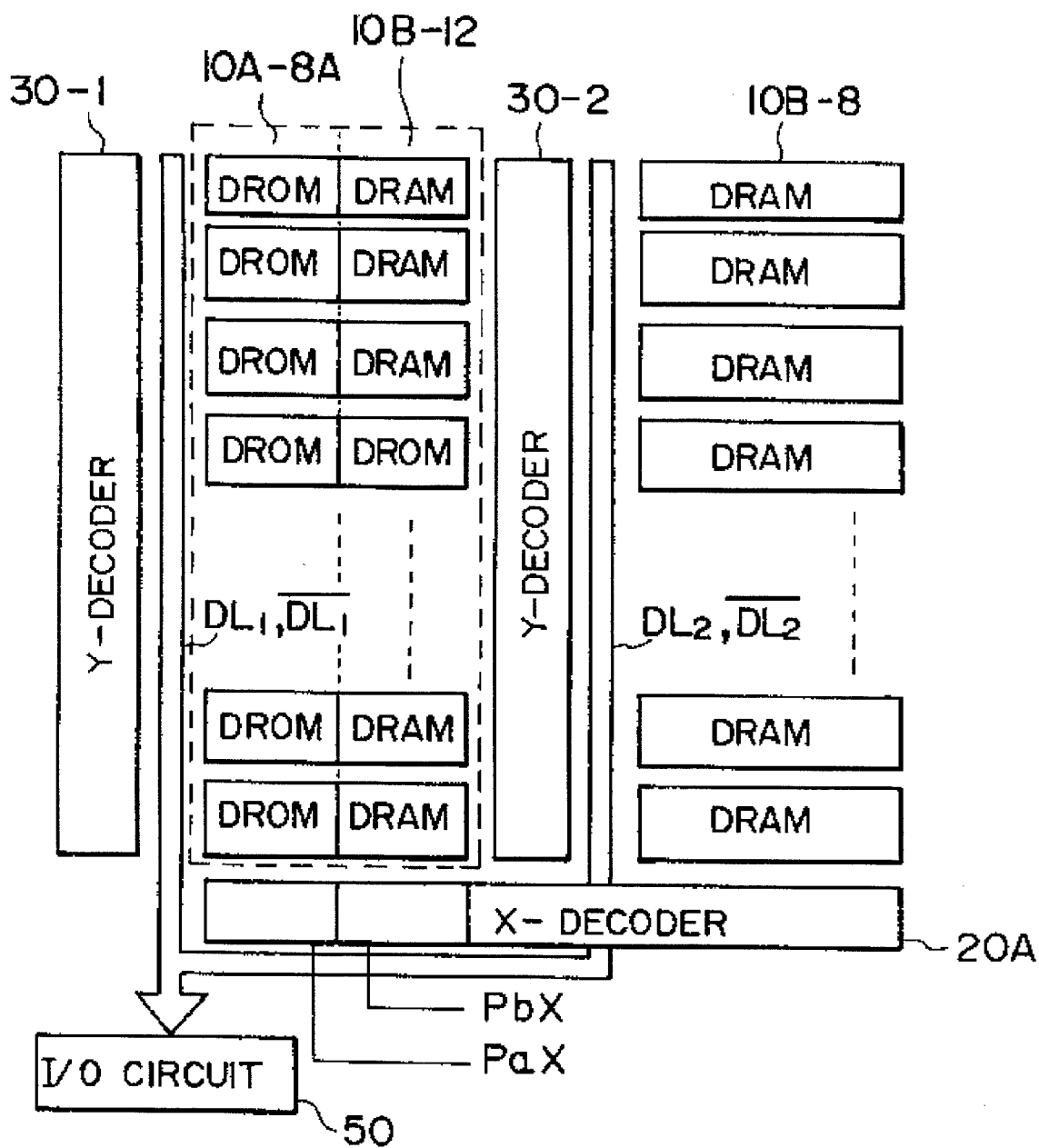
FIG. 29 is a view depicting a schematic layout of a semiconductor memory device according to a nineteenth embodiment of the present invention.

A nineteenth embodiment of the present invention will next be described with reference to FIG. 29. FIG. 29 is a view illustrating a schematic layout of a semiconductor memory device according to the nineteenth embodiment. In this case, the same elements of structure as those shown above are identified by like reference numerals and their description will therefore be omitted. Specific configurations and functions of these elements will be easily understood by reference to the aforementioned embodiments, particularly, the fifteenth embodiment shown in FIG. 24.

In the semiconductor memory device according to the present embodiment, the DROM unit 10A-8B employed in the semiconductor memory device shown in FIG. 24 is replaced by a DRAM unit 10B-12. The operation of the semiconductor memory device can be easily understood by reference to that of the semiconductor memory device according to the fifteenth embodiment.

According to the semiconductor memory device showing the present embodiment, a DROM unit 10A-8A and a DRAM unit 10B-12 can be changed over from one to another based on selection signals PaX and PbX during operation. Further, either a semiconductor memory device of a type wherein a DRAM unit and a DROM unit are mixed together or a semiconductor memory device comprised of a DRAM unit alone can be selected by effecting trimming using a laser or the like under the state of a wafer.

If the layout of the semiconductor memory device according to the present embodiment is applied to each of the semiconductor memory devices according to the first through fifth embodiments, then the aforementioned advantageous effect can be obtained.

Figure 30:
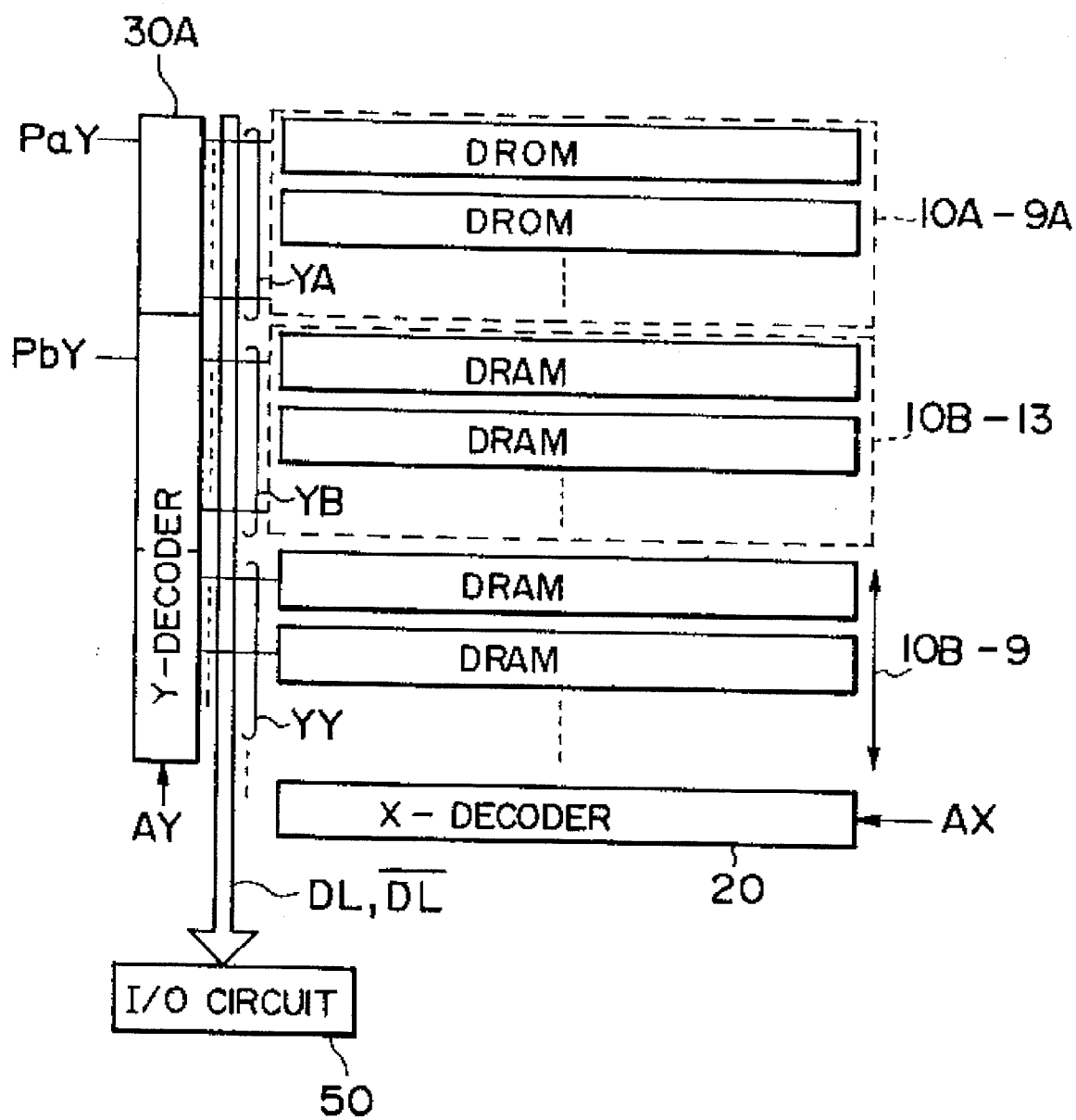
FIG. 30 is a view illustrating a schematic layout of a semiconductor memory device according to a twentieth embodiment of the present invention.

A twentieth embodiment of the present invention will next be described with reference to FIG. 30. FIG. 30 is a view illustrating a schematic layout of a semiconductor memory device according to the twentieth embodiment. In this case, the same elements of structure as those shown above are identified by like reference numerals and their description will therefore be omitted. Specific configurations and functions of these elements will be easily understood by reference to the aforementioned embodiments, particularly, the sixteenth embodiment shown in FIG. 25.

In the semiconductor memory device according to the present embodiment, the DROM unit 10A-9B employed in the semiconductor memory device shown in FIG. 25 is replaced by a DRAM unit 10B-13. The operation of the semiconductor memory device can be easily understood by reference to that of the semiconductor memory device according to the sixteenth embodiment.

According to the semiconductor memory device showing the present embodiment, a DROM unit 10A-9A and a DRAM unit 10B-13 can be changed over from one to another based on selection signals PaY and PbY during operation. Further, either a semiconductor memory device of a type wherein a DRAM unit and a DROM unit are mixed together or a semiconductor memory device comprised of a DRAM unit alone can be selected by effecting trimming using a laser or the like under the state of a wafer.

If the layout of the semiconductor memory device according to the present embodiment is applied to each of the semiconductor memory devices according to the first through fifth embodiments, then the aforementioned advantageous effect can be obtained.

Figure 31:
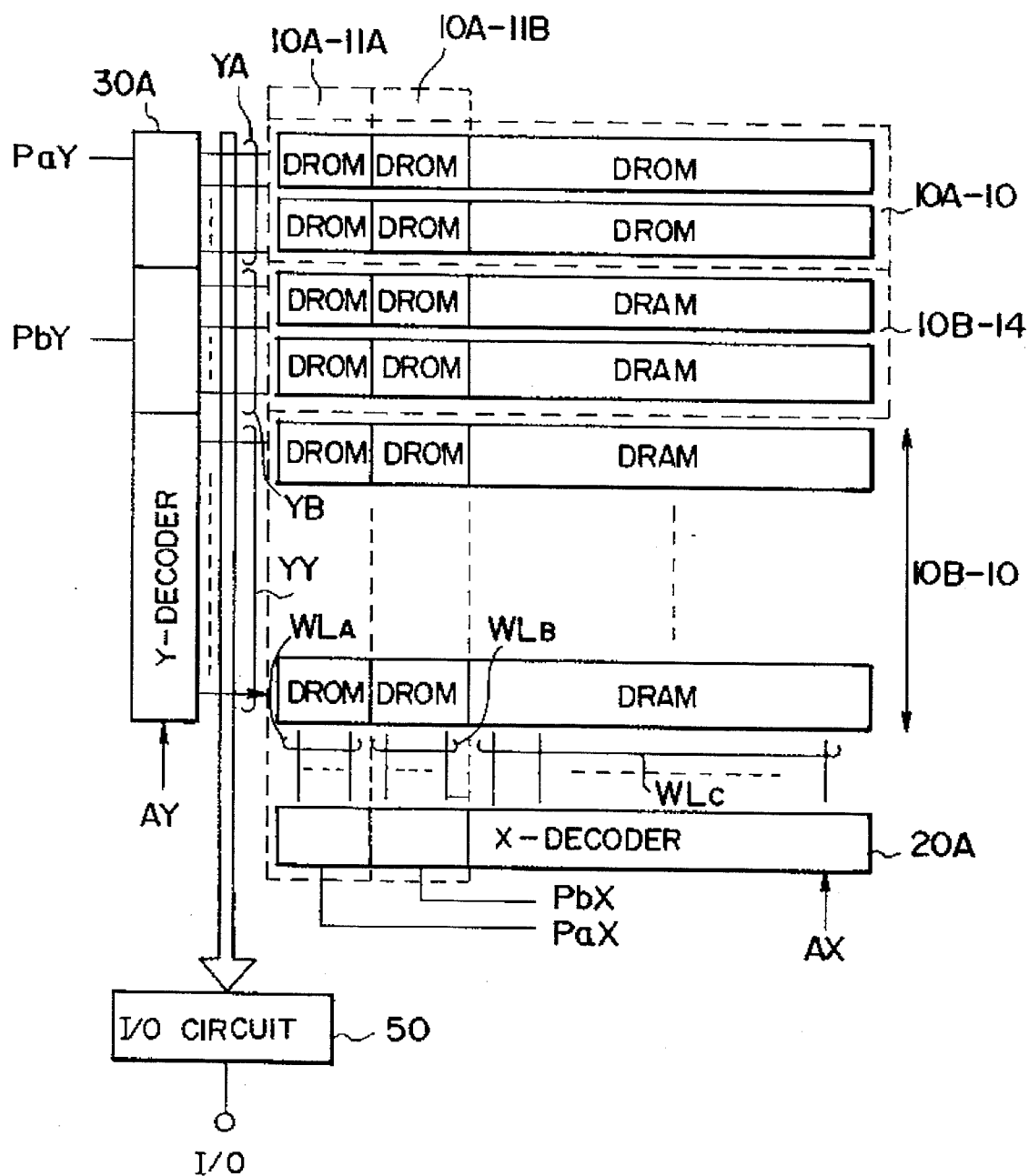
FIG. 31 is a view showing a schematic layout of a semiconductor memory device according to a twenty-first embodiment of the present invention.

A twenty-first embodiment of the present invention will next be described with reference to FIG. 31. FIG. 31 is a view illustrating a schematic layout of a semiconductor memory device according to the twenty-first embodiment. In this case, the same elements of structure as those shown above are identified by like reference numerals and their description will therefore be omitted. Specific configurations and functions of these elements will be easily understood by reference to the aforementioned embodiments, particularly, the seventeenth embodiment shown in FIG. 27.

In the semiconductor memory device according to the present embodiment, a part of the DROM unit 10A-10 employed in the semiconductor memory device shown in FIG. 27 is replaced by a DRAM unit 10B-14. The operation of the semiconductor memory device can be easily understood by reference to that of the semiconductor memory device according to the seventeenth embodiment.

According to the semiconductor memory device showing the present embodiment, DROM units 10A-10, 10A-11A and 10A-11B and DRAM units 10B-10 and 10B-14 can be respectively changed over from one another based on selection signals PaX and PbX and PaY and PbY along X and Y directions during operation. Further, either a semiconductor memory device of a type wherein a DRAM unit and a DROM unit are mixed together or a semiconductor memory device comprised of a DRAM unit alone can be selected by effecting trimming using a laser or the like under the state of a wafer.

If the layout of the semiconductor memory device according to the present embodiment is applied to each of the semiconductor memory devices according to the first through fifth embodiments, then the aforementioned advantageous effect can be obtained.

According to each of the semiconductor memory devices of the present invention, as has been described above, the volatile memory cells and the non-volatile memory cells can be provided within the single memory cell array. Further, the volatile memory cells and the non-volatile memory cells can be easily and inexpensively formed within the single memory cell array. Moreover, the semiconductor memory device having the high flexibility can be realized wherein the rate of the volatile memory cells to the non-volatile memory cells can be easily decided according to the user's demand.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A memory comprising:
   a semiconductor substrate having a main surface;
   a bit line;
   a first memory cell including a first transistor and a first capacitor, both a source and a drain of the first transistor being formed in the main surface, the first capacitor being electrically connected to the source of the first transistor through a first node, the drain of the first transistor being connected to the said bit line;
   a second memory cell including a second transistor and a second capacitor, both a source and a drain of the second transistor being formed in the main surface, the second capacitor being electrically connected to the source of the second transistor through a second node, the drain of the second transistor being connected to said bit line;
   a third memory cell including a third transistor and a third capacitor, both a source and a drain of the third transistor being formed in the main surface, the third capacitor being electrically connected to the source of the third transistor through a third node, the drain of the third transistor being connected to said bit line; and
   a conductive layer formed above the first, second and third transistors, said conductive layer having a predetermined potential, and being connected at the first and third nodes to the sources of said first and third transistors and the first and third capacitors.

2. The memory according to claim 1, wherein the predetermined potential is a power supply potential.

3. The memory according to claim 1, wherein the predetermined potential equals to a potential of the ground.

4. The memory according to claim 1 wherein said conductive layer is disconnected from the second node so that said second memory cell stores variable data, said first and third memory cells storing fixed data corresponding to the predetermined potential.

5. A memory cell array of a semiconductor memory device comprising:
   a first memory group storing variable data, including
      a first plurality of memory cells each storing variable data, and
      a bit line connected to the first memory cells; and a second memory group having means for storing fixed data, including
   a second plurality of memory cells connected to the bit line, each cell for storing fixed data, each cell including a transistor and a capacitor connected to the transistor through a memory cell node, and
   a conductive line connected to the second plurality of memory cells through the memory cell nodes.

6. The memory cell array according to claim 5, wherein the conductive lie has a predetermined potential.

7. The memory cell array according to claim 6, wherein the predetermined potential is a power supply potential.

8. The memory cell array according to claim 6, wherein the predetermined potential is a ground potential.

* * * * *